US 9,225,049 B2

(12) United States Patent
Nakase et al.

(10) Patent No.: US 9,225,049 B2
(45) Date of Patent: Dec. 29, 2015

(54) NOISE SUPPRESSION STRUCTURE

(75) Inventors: Koichiro Nakase, Tokyo (JP); Eiji Hankui, Tokyo (JP)

(73) Assignee: NEC CORPORATION, Tokyo (JP)

( * ) Notice: Subject to any disclaimer, the term of this patent is extended or adjusted under 35 U.S.C. 154(b) by 492 days.

(21) Appl. No.: 13/637,864

(22) PCT Filed: Mar. 25, 2011

(86) PCT No.: PCT/JP2011/057479
§ 371 (c)(1),
(2), (4) Date: Sep. 27, 2012

(87) PCT Pub. No.: WO2011/122502
PCT Pub. Date: Oct. 6, 2011

(65) Prior Publication Data
US 2013/0015926 A1    Jan. 17, 2013

(30) Foreign Application Priority Data
Mar. 30, 2010    (JP) .................................. 2010-078477

(51) Int. Cl.
*H01P 1/20*    (2006.01)
*H01P 3/06*    (2006.01)
(Continued)

(52) U.S. Cl.
CPC    *H01P 1/20* (2013.01); *H01L 23/66* (2013.01); *H01P 1/219* (2013.01); *H01P 3/06* (2013.01); *H01P 5/026* (2013.01); *H05K 1/0251* (2013.01); *H01L 2223/6627* (2013.01);
(Continued)

(58) Field of Classification Search
CPC ............. H01P 5/026; H01P 3/06; H01P 1/20; H05K 1/0236; H05K 2201/09263; H05K 1/165; H05K 1/0233; H05K 1/0251; H05K 2001/09618

USPC .................. 333/12, 22 R, 181, 206, 243, 246
See application file for complete search history.

(56) References Cited

U.S. PATENT DOCUMENTS 6,323,745 B1 *  11/2001  Toncich ......................... 333/204
6,670,863 B2 *  12/2003  Van Helvoort et al. ......... 333/12
7,164,898 B2 *   1/2007  Hankui et al. ................. 455/311

FOREIGN PATENT DOCUMENTS

JP    07-202519    8/1995
JP    2002-151924  5/2002
(Continued)

OTHER PUBLICATIONS

International Search Report, PCT/JP2011/057479, Jun. 28, 2011.

*Primary Examiner* — Benny Lee
*Assistant Examiner* — Rakesh Patel
(74) *Attorney, Agent, or Firm* — Young & Thompson

(57) ABSTRACT

A noise suppression structure for suppressing an undesired high-frequency current in a transmission line (i.e. a sleeve) of a short-circuited termination type includes a conductor base encompassing the periphery of the transmission line and a conductor short-circuiting part which is connected to the transmission line at the opposite side to an open end of the conductor base and whose inductance is greater than that of the conductor base. It is possible to increase an inductance by modifying the shape of the terminal end of the sleeve, equivalent to a quarter wavelength of an undesired high-frequency current which occurs in a wireless circuit of a mobile wireless terminal and flows through a ground layer, thus reducing the entire length and realizing miniaturization while securing desired input impedance.

4 Claims, 22 Drawing Sheets

(51) Int. Cl.
*H01P 5/02* (2006.01)
*H01L 23/66* (2006.01)
*H01P 1/219* (2006.01)
*H05K 1/16* (2006.01)
*H05K 1/02* (2006.01)

(52) U.S. Cl.
CPC .............. *H01L 2224/16225* (2013.01); *H01L 2924/15192* (2013.01); *H05K 1/0233* (2013.01); *H05K 1/165* (2013.01); *H05K 2201/09263* (2013.01); *H05K 2201/09618* (2013.01)

(56) References Cited

FOREIGN PATENT DOCUMENTS

| | | |
|---|---|---|
| JP | 2002-151949 | 5/2002 |
| JP | 2003-008319 | 1/2003 |
| JP | 2003-224408 | 8/2003 |
| JP | 2003-243911 | 8/2003 |
| JP | 2003-347692 | 12/2003 |
| JP | 3574420 | 10/2004 |
| WO | WO 02/19461 | 3/2002 |

\* cited by examiner

NOISE SUPPRESSION STRUCTURE

TECHNICAL FIELD

The present invention relates to a noise suppression structure suppressing an undesired high-frequency current in a miniature electronic device, and in particular to a noise suppression structure that reduces a noise current flowing between a wireless circuit and a digital circuit, installed in a mobile wireless terminal, thus suppressing an electromagnetic interference therebetween.

The present application claims priority on Japanese Patent Application No. 2010-78477 filed Mar. 30, 2010, the entire content of which is incorporated herein by reference.

BACKGROUND ART

FIG. 28 shows a simplified structure of a printed wiring substrate 100 of a mobile wireless terminal including a wireless circuit and a digital circuit.

The printed wiring substrate 100 includes a signal wire/power layer 101 and a ground layer G in order to achieve the functionality of a mobile wireless terminal. A wireless circuit 102 and a digital circuit 103 are mounted on the upper surface of the ground layer G. Since the ground layer G is shared by the wireless circuit 102 and the digital circuit 103, a signal transmitted from the digital circuit 103 may include a large number of high-frequency components, causing an undesired high-frequency current (i.e. a noise current) which may be transmitted through the ground layer G and enter into the wireless circuit 102. An antenna and a power circuit (not shown) are mounted on the printed wiring substrate 100.

A mobile wireless terminal utilizes a balanced antenna such as a dipole antenna disclosed in Patent Literature 1. In a noise suppression structure shown in FIG. 29, a balanced antenna 110 is connected to the wireless circuit 102 via a coaxial line 111, wherein the coaxial line 111 is configured of an outer conductor 111A and an inner conductor 111B. A sleeve 113 of a cylindrical shape whose terminal end is short-circuited with a doughnut-type short-circuiting plane 112 is used as the outer conductor 111A of the coaxial line 111. The leading end of the sleeve 113 is an open end 113A.

To suppress an undesired high-frequency current i flowing through the outer conductor 111A of the coaxial line 111, the sleeve 113 may function as a balun connected between the balanced antenna 110 and the coaxial line 111 of an unbalanced line. The length l of the sleeve 113 is equal to a quarter of the wavelength $\lambda$ of an undesired high-frequency current, wherein it is possible to prevent the flowing of an undesired high-frequency current i because of an infinite input impedance of a sleeve open end at an operating frequency of the balanced antenna 110 in theory. This structure suppresses electromagnetic noise occurring due to an inconsistency of balance-unbalance conversion.

Patent Literatures 2 to 4 are listed as technologies for suppressing the foregoing undesired high-frequency currents (i.e. noise currents).

A mobile wireless terminal disclosed in Patent Literature 2 is equipped with an antenna substrate, an antenna element serving as an antenna pattern formed on the antenna substrate, a coaxial cable feeding power to the antenna element, and a dielectric sleeve attached to the distal end of the coaxial cable, all of which are attached to the surface opposite to the surface of a printed wiring substrate mounting a speaker thereon.

A mobile wireless terminal disclosed in Patent Literature 3 is designed such that a coaxial cable is connected to an antenna/printed wiring substrate and covered with a bazooka. The bazooka is designed such that a dielectric inner cylinder is engaged with a conductor inner cylinder in a dielectric outer cylinder, wherein the lower end of the dielectric outer cylinder and the conductor inner cylinder is a short-circuited surface while the upper end thereof is an open end. Herein, the length of the dielectric outer cylinder and the dielectric inner cylinder is reduced from "¼λ" to "1/√∈r" owing to a dielectric constant ∈r.

A mobile wireless terminal disclosed in Patent Literature 4 includes a coaxial cable feeding power to first and second antenna elements formed on an antenna substrate, wherein first and second resonating conductors are separated from each other and disposed in the longitudinal direction of the coaxial cable, thus forming a dielectric sleeve connected to the coaxial cable in which the distal end is open while the other end is short-circuited. The length of the dielectric sleeve is reduced from "¼λ" to "1/√∈r" owing to a dielectric constant ∈r.

CITATION LIST

Patent Literature

Patent Literature 1: Japanese Patent No. 3574420
Patent Literature 2: Japanese Patent Application Publication No. 2002-151924
Patent Literature 3: Japanese Patent Application Publication No. 2002-151949
Patent Literature 4: Japanese Patent Application Publication No. 2003-8319

SUMMARY OF INVENTION

Technical Problem

In a mobile telephone system with a base station which is located at a remote place, a user terminal may receive very small signals with the antenna and the wireless circuit thereof. For this reason, an undesired high-frequency current of a radio frequency, which leaks from the digital circuit, propagates through the ground layer and then enters into the wireless circuit, wherein a small wireless signal is convoluted and interfered with noise, and therefore the communication quality such as the reception sensitivity will be degraded.

A bazooka or a sleeve of a short-circuited termination type with a length equivalent to a quarter wavelength of an undesired high-frequency current may be able to suppress an unwanted high-frequency current, but the size thereof is too large to be applied to a mobile wireless terminal which needs to be miniaturized. For example, the length of a sleeve equivalent to a quarter wavelength is set to about 93 mm with respect to a wireless communication signal at 800 MHz.

Additionally, Patent Literatures 2 to 4 may partially refer to a technology for reducing the length of a sleeve, but it is impossible to adequately reduce the length of a sleeve by way of a reduction of the length based on the dielectric constant ∈r. In the air, the wavelength $\lambda$ is calculated according to Equation 1 where the dielectric constant ∈r is "1". In this connection, $\lambda$ denotes wavelength; $C_0$ denotes the speed of light under vacuum; f denotes frequency; and ∈r denotes a dielectric constant.

$$\lambda = \frac{C_0}{f\sqrt{\varepsilon r}} \qquad \text{[Equation 1]}$$

The present invention is made in consideration of the foregoing circumstances, wherein it is an object of the present invention to reduce a transmission line (i.e. a sleeve) of a short-circuited termination type suppressing an undesired high-frequency current, thus providing a noise suppression structure which can be entirely miniaturized in size.

Solution to Problem

The present invention relates to a noise suppression structure for suppressing an undesired high-frequency current in a transmission line (i.e. a sleeve) of a short-circuited termination type, providing a current controller including a conductor base encompassing the periphery of the transmission line, and a conductor short-circuiting part which is connected to the transmission line at the opposite side to an open end of the conductor base and whose inductance is greater than that of the conductor base.

A noise suppression structure of a short-circuited termination type for suppressing an undesired high-frequency current flowing through a ground layer of a printed wiring substrate provides a current controller including a conductor base which is positioned apart from the ground layer with an interval therebetween in the thickness direction, and a conductor short-circuiting part which is connected to the ground layer at the opposite side to an open end of the conductor base and whose inductance is greater than that of the conductor base.

Advantageous Effects of Invention

By providing an idea for modifying the shape of the terminal end of a sleeve whose length is equivalent to a quarter wavelength of an undesired high-frequency current which occurs in a wireless circuit of a mobile wireless terminal and flows through a ground layer, it is possible to reduce the entire length and realize miniaturization while securing a desired input impedance. This makes it possible to reduce the length of a sleeve to be shorter than a quarter length of an undesired high-frequency current; hence, it is possible to miniaturize a printed wiring substrate installed in a mobile wireless terminal.

DESCRIPTION OF EMBODIMENTS

Figure 1:
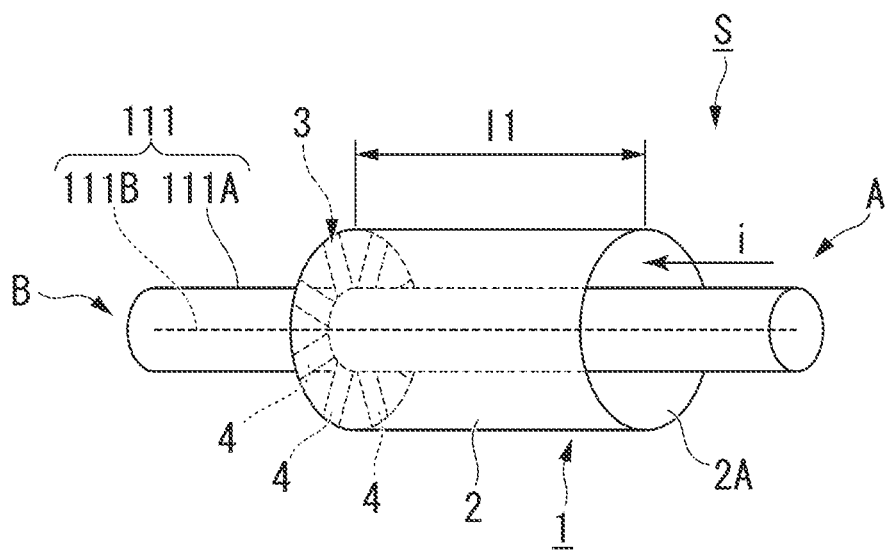
FIG. 1 A perspective view showing a noise suppression structure according to a first embodiment of the present invention.

A noise suppression structure according to the present invention will be described by way of examples with reference to the accompanying drawings. In the drawings, the same constituent elements are denoted using the same reference signs; hence, duplicate descriptions thereof will be omitted.

First Embodiment

A noise suppression structure according to a first embodiment of the present invention will be described with reference to FIGS. 1 to 3.

First, a current controller of a mobile wireless terminal adopting the present invention will be described with reference to FIG. 3. Herein, reference sign S denotes a current controller attenuating an undesired high-frequency current (i.e. a noise current). The entire length of the current controller S is "$l_1+l_2$".

A transmission line which is shorter than a quarter wavelength is equivalent to an inductance. Assuming a quarter wavelength ($\lambda/4$) line of a short-circuited termination type with a characteristic resistance $R_0$ (i.e. a real part of a characteristic impedance) and a length of $l_1+l_2$ as shown in FIG. 3. An input impedance Zin will not be changed even when a short-circuited terminal end portion of the current controller S with the length l2 is changed with an inductance calculated via Equation 2. In this connection, L denotes an inductance; R0 denotes a characteristic resistance; f denotes frequency; $\lambda$ denotes wavelength; and $l_2$ denotes a partial length of a line.

$$L = \frac{R_0}{2\pi f} \tan\frac{2\pi}{\lambda} l_2 \quad \text{[Equation 2]}$$

As described above, it is possible to reduce the length of a transmission line from $l_1+l_2$ to $l_2$. Based on this idea, an input impedance of a sleeve of a transmission line which is reduced in length will be identical to an input impedance of a transmission line which is not reduced in length when the terminal end portion of a quarter wavelength sleeve of a short-circuited termination type is modified in shape so that the inductance thereof will be increased. In the following description, a portion of the current controller S with the length $l_1$ will be referred to as a conductor base while another portion with the length $l_2$ will be referred to as a conductor short-circuiting part.

The noise suppression structure of the first embodiment shown in FIG. 1 employs a sleeve 1 serving as the current controller S of a mobile wireless terminal.

Figure 29:
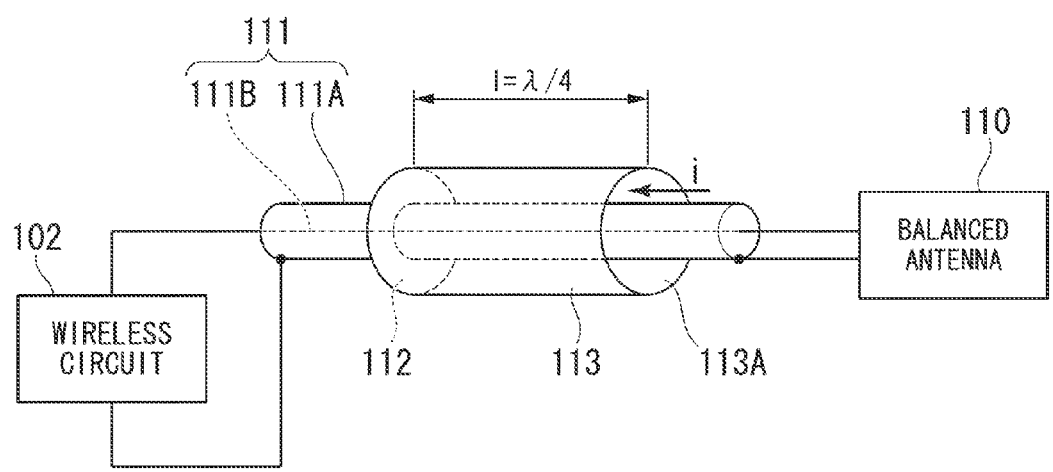
FIG. 29 An illustration showing the conventional noise suppression structure using a sleeve which is terminated with a doughnut-type short-circuiting plane.

The sleeve 1 is equivalent to the conventional cylindrical sleeve 113 shown in FIG. 29, showing an extracted portion of the coaxial line 111 connecting between the balanced antenna 110 and the wireless circuit 102. The sleeve 1 is disposed in the outer conductor 111A of the coaxial line 111, consisting of the outer conductor 111A and the inner conductor 111B, and equipped with a cylindrical conductor base 2 covering the outer conductor 111A, wherein the conductor base 2 is connected to a conductor short-circuiting part 3 short-circuiting the coaxial line 111.

The length of the conductor base 2 of the sleeve 1 is shorter than a quarter wavelength of an undesired high-frequency current flowing through the outer conductor 111A, wherein the conductor short-circuiting part 3 connected to the outer conductor 111A of the coaxial line 111 is configured of a plurality of linear conductors 4. That is, conductor short-circuiting part 3 is not configured of a conventional doughnut-type conductor but configured of a plurality of linear conductors 4, thus increasing the inductance thereof. Thus, it is possible to realize an infinite input impedance in the open end 2A of the sleeve 1 in theory at the frequency of an undesired high-frequency current i flowing through the outer conductor 111A of the coaxial line 111 even though the length of the conductor base 2 is shorter than a quarter wavelength.

This makes it possible to suppress an undesired high-frequency current i, flowing through the outer conductor 111A of the coaxial line 111 from the side A, from propagating through the open end 2A of the conductor base 2, thus reducing the undesired high-frequency current i reaching the B side downstream. As a result, it is possible to suppress an undesired high-frequency current i, propagating through the outer conductor 111A of the coaxial line 111, while reducing the entire length of the sleeve 1, thus achieving miniaturization of a mobile wireless terminal including the sleeve 1.

As described above, the noise suppression structure of the first embodiment is designed such that the conductor short-circuiting part 3 disposed proximate to the terminal end of the sleeve 1 of a short-circuited termination type is configured of linear conductors 4, thus increasing the inductance thereof. Thus, it is possible to shorten the length of the sleeve 1, and therefore it is possible to miniaturize the entirety of a mobile wireless terminal including the noise suppression structure of the first embodiment.

(First Variation)

Figure 2:
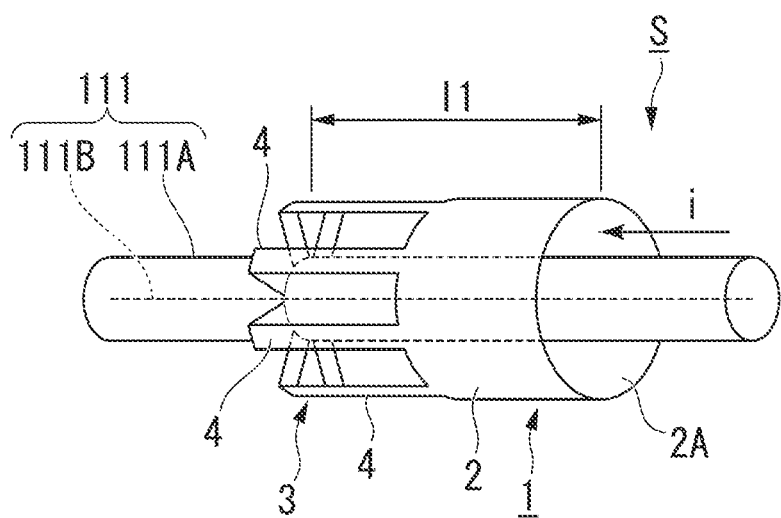
FIG. 2 A perspective view showing a noise suppression structure according to a first variation of the first embodiment.
Figure 3:
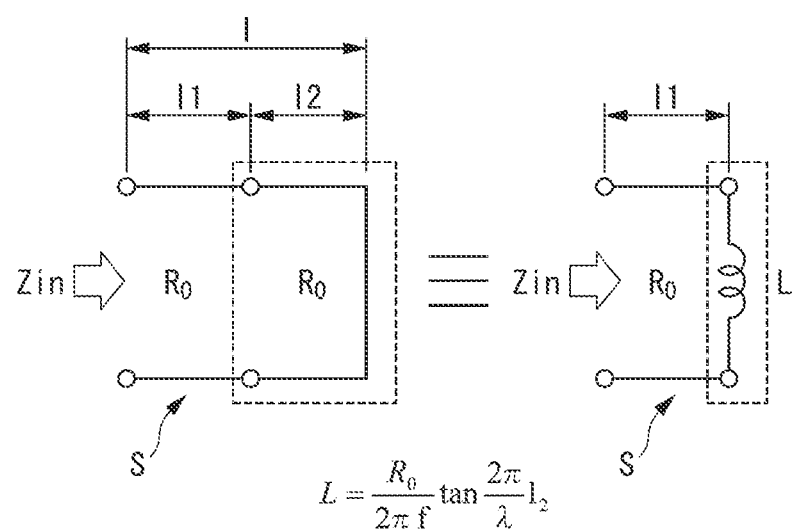
FIG. 3 A circuit diagram illustrating a principle of reducing the length of a noise suppression structure.

In the first embodiment, the conductor short-circuiting part 3 connecting between the cylindrical sleeve 1 and the outer conductor 111A of the coaxial line 111 is configured of the linear conductors 4, but it is possible to elongate the linear conductors 4 in the length direction of the cylindrical conductor base 2 as shown in FIG. 2, thus increasing an installation ratio of the linear conductors 4. That is, it is possible to further increase an inductance by elongating a plurality of linear conductors 4, branched from the cylindrical sleeve 1, and therefore it is possible to further miniaturize the noise suppression structure suppressing an undesired high-frequency current i propagating through the outer conductor 111A of the coaxial line 111.

(Second Variation)

In the first embodiment, the conductor short-circuiting part 3 connecting between the cylindrical sleeve 1 and the outer conductor 111A of the coaxial line 111 is configured of the linear conductors 4; but this is not a restriction. For example, it is possible to further increase an inductance by forming the linear conductors 4 in a meandering shape or a spiral shape.

Second Embodiment

A noise suppression structure according to a second embodiment of the present invention will be described with reference to FIGS. 4 and 5.

Figure 4:
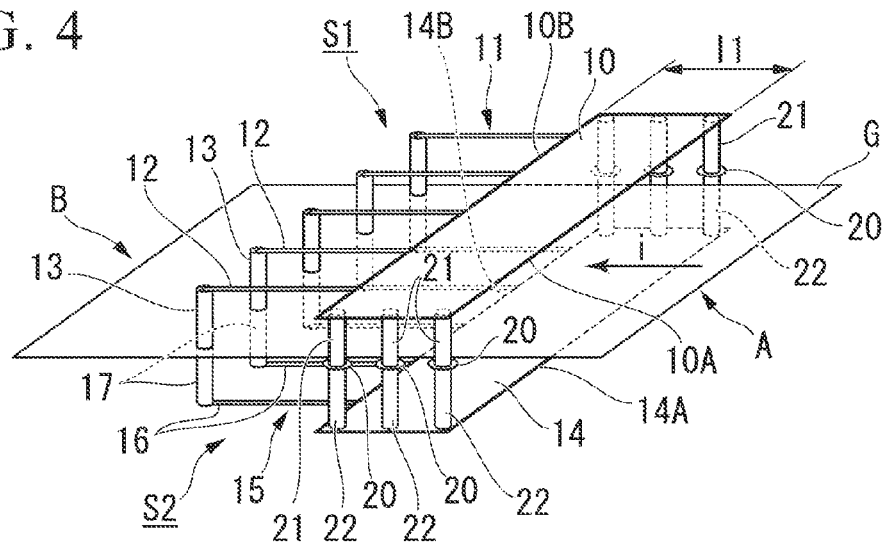
FIG. 4 A perspective view of a printed wiring substrate adopting a noise suppression structure according to a second embodiment of the present invention.
Figure 5:
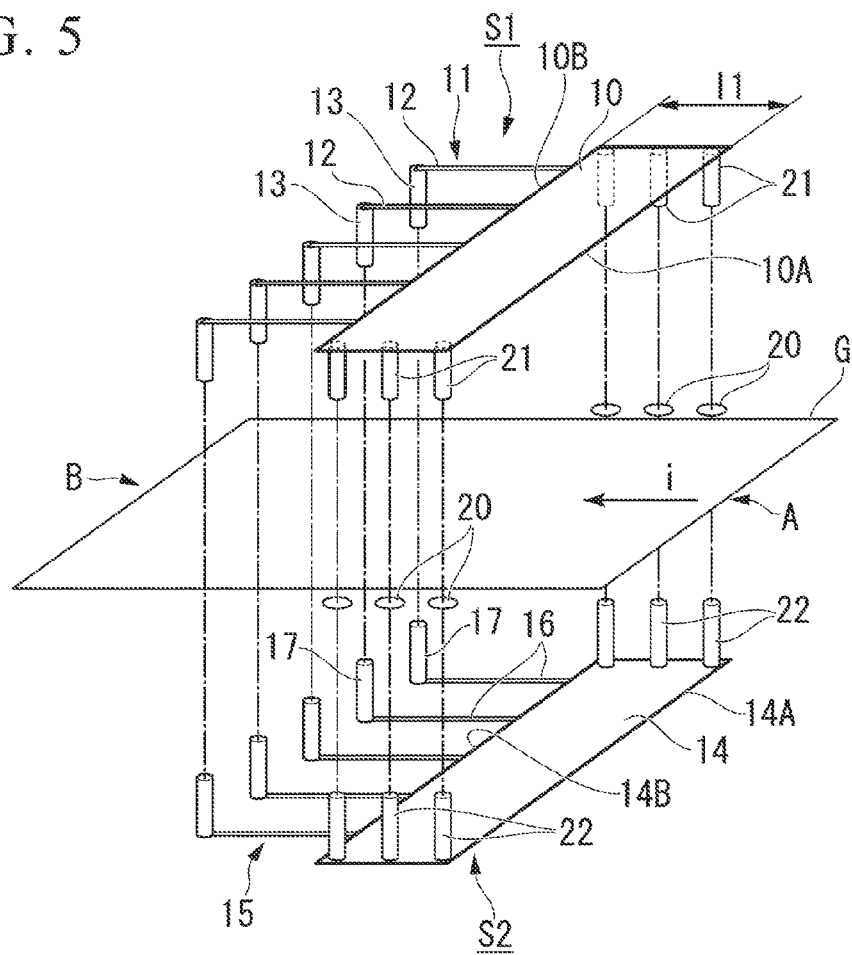
FIG. 5 An exploded view of the printed wiring substrate shown in FIG. 4.

The second embodiment is an application of the current controller S (S1, S2) to a ground layer G in a printed wiring substrate of a mobile wireless terminal FIG. 4 is a perspective view of a printed wiring substrate of a mobile wireless terminal, and FIG. 5 is an exploded view expanding conductive layers. FIGS. 4 and 5 show the minimum constitution of the second embodiment precluding various parts (e.g. a wireless circuit, a digital circuit, etc.), installed in a printed wiring substrate, and insulating layers.

As shown in FIGS. 4 and 5, the current controllers S1, S2 include conductor bases 10, 14 whose lengths are shorter than a quarter wavelength (λ/4) of an undesired high-frequency current i flowing through the ground layer G. The conductor bases 10, 14 are disposed in the upper and lower layers of a conductor configuring the ground layer G and aligned in the positional relationship in which they are symmetrical to each other via the ground layer G.

The current controller S1 is configured of the rectangular conductor base 10, which is disposed in parallel to the ground layer G, and a conductor short-circuiting part 11 extending from the conductor base 10 to the ground layer G, wherein the side A of the conductor base 10 is an open end 10A. The conductor short-circuiting part 11 is configured of a plurality of thin conductive lines 12, connected to an end 10B opposite to the open end 10A of the conductor base 10, and a plurality of vias 13 connecting the thin conductive lines 12 to the ground layer G. Thus, it is possible to increase an inductance by interposing a plurality of thin conductive lines 12.

Similarly, the current controller S2 is configured of the rectangular conductor base 14, which is disposed in parallel to the ground layer G, and a conductor short-circuiting part 15 extending from the conductor base 14 to the ground layer G, wherein the side A of the conductor base 14 is an open end 14A. The conductor short-circuiting part 15 is configured of a plurality of thin conductive line 16, connected to an end 14B opposite to the open end 14A of the conductor base 14, and a plurality of vias 17 connecting the thin conductive lines 16 to the ground layer G. Thus, it is possible to increase an inductance by interposing a plurality of thin conductive lines 16.

Additionally, the conductor bases 10, 14 of the current controllers S1, S2 include vias 21, 22 which are connected to the opposite ends across the ground layer G via via-lands 20.

In comparison between the first embodiment and the second embodiment, the ground layer G in FIGS. 4 and 5 is equivalent to the outer conductor 111A of the coaxial line 111 in FIGS. 1 and 2. Additionally, the current controllers S1, S2 in FIGS. 4 and 5 are equivalent to the cylindrical sleeve 1 in FIGS. 1 and 2. Moreover, the thin conductive lines 12, 16 and the vias 13, 17 in FIGS. 4 and 5 are equivalent to the linear conductors 4 of the sleeve 1 in FIGS. 1 and 2.

In order to suppress an undesired high-frequency current i propagating through the ground layer G from the side A to the side B in FIGS. 4 and 5, the open ends 10A, 14A of the current controllers S1, S2 are disposed in the side A while the conductor short-circuiting parts 11, 15 connected to the ground layer G are disposed in the side B. Thus, it is possible to suppress an undesired high-frequency current i, which enters from the side A and flows upstream of the ground layer G, from propagating at the open end 10A of the current controller S1, whilst it is possible to suppress an undesired high-frequency current i, which flows downstream of the ground layer G, from propagating at the open end 14A of the current controller S2; hence, it is possible to reduce an undesired high-frequency current i reaching the side B. As a result, it is possible to reduce an undesired high-frequency current i of a radio frequency, which leaks from a digital circuit and propagates though a the ground layer G of a printed wiring substrate of a mobile wireless terminal including a wireless circuit and a digital circuit, and therefore it is possible to suppress an undesired high-frequency current i from entering into a wireless circuit, thus improving the wireless communication quality of a mobile wireless terminal.

As described above, the noise suppression structure of the second embodiment is designed such that the conductor short-circuiting parts 11, 15, which are disposed proximate to the terminal ends of the current controllers S1, S2 of a short-circuited termination type, are configured of thin conductive lines 12, 16 so as to increase an inductance, thus shortening the lengths of the current controllers S1, S2 and thereby achieving miniaturization on the entirety of a mobile wireless terminal.

(First Variation)

Figure 6:
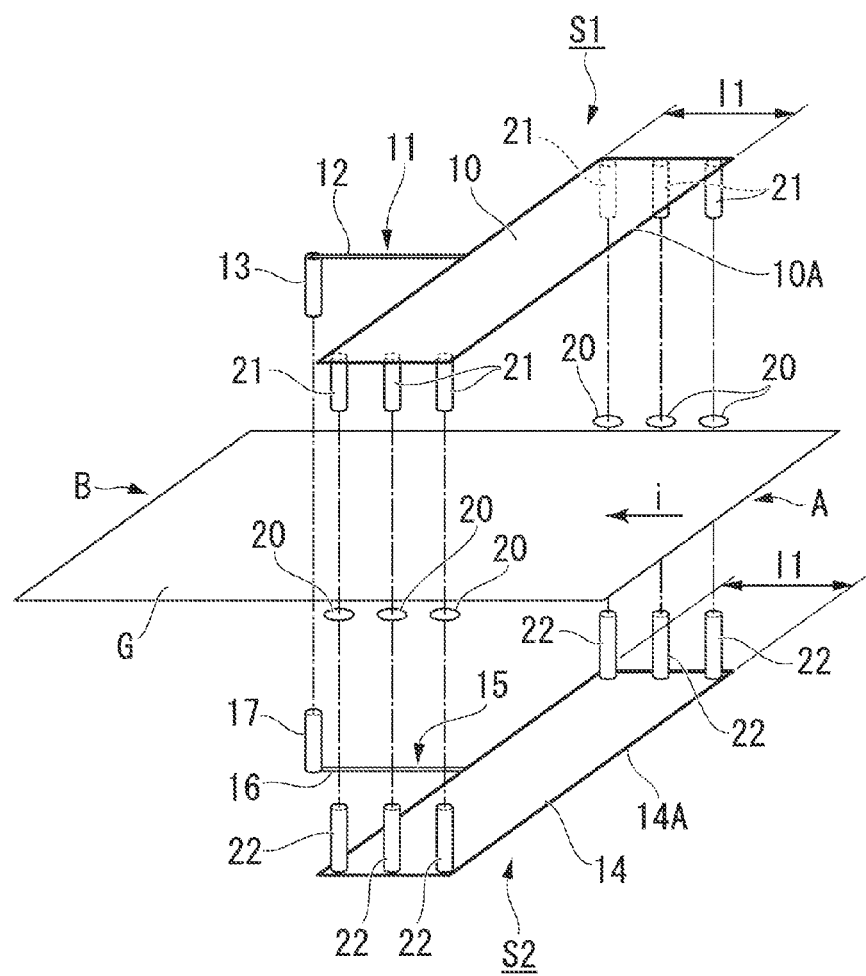
FIG. 6 An exploded view showing a noise suppression structure according to a first variation of the second embodiment.

The second embodiment is designed to adopt a plurality of thin conductive lines 12, 16 serving as the conductor short-circuiting parts 11, 15 of the current controllers S1, S2; but this is not a restriction. As shown in FIG. 6, for example, the conductor short-circuiting parts 11, 15 may adopt single thin conductive lines 12, 16 and single vias 13, 17, with which they are connected to the ground layer G.

(Second Variation)

The second embodiment is designed to prevent noise from propagating from one circuit to another circuit by way of the open ends 10A, 14A arranged in the side A of the current controllers S1, S2; but this is not a restriction. It is possible to prevent noise from propagating from both circuits to the other circuit.

Figure 7:
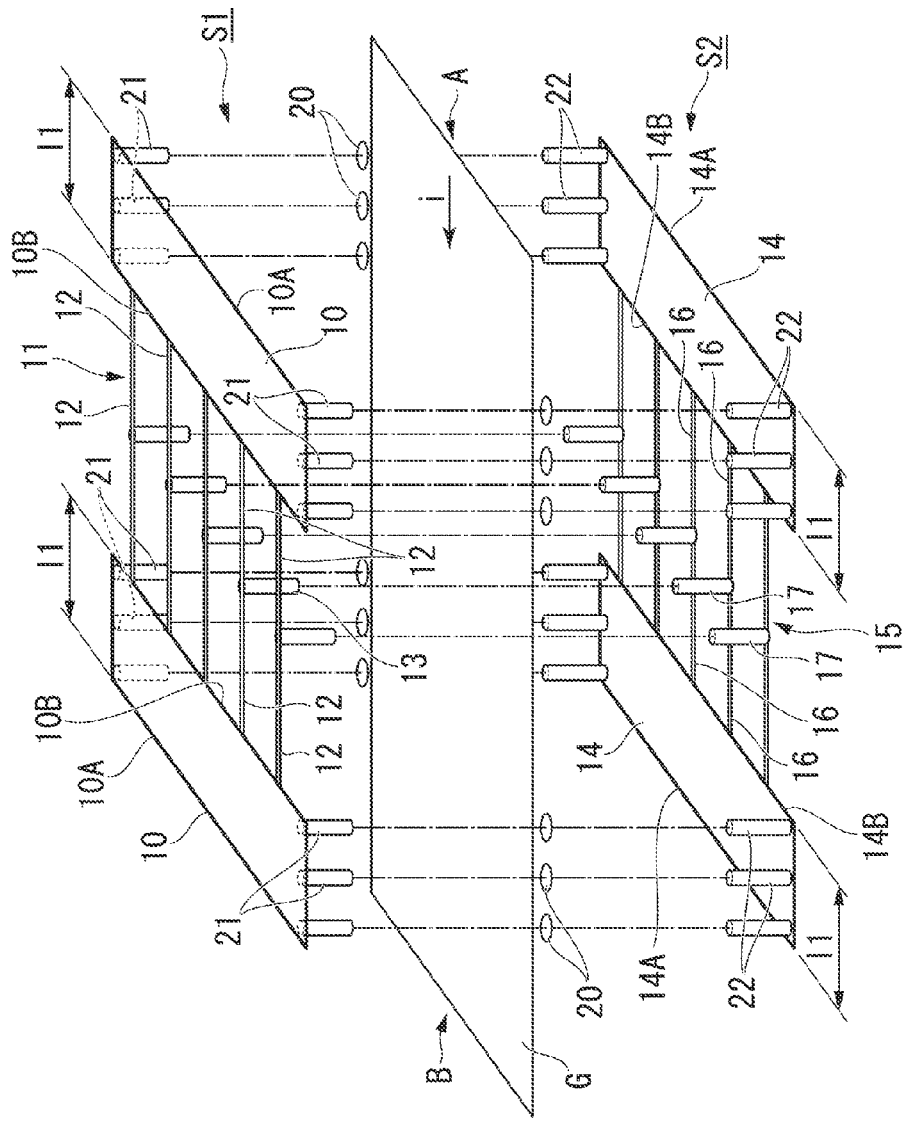
FIG. 7 An exploded view showing a noise suppression structure according to a second variation of the second embodiment.

FIG. 7 is an exploded view of a noise suppression structure according to the second embodiment, wherein a pair of conductor bases 10 is juxtaposed via an interval therebetween in the length direction such that the side A and the side B of the current controller S1 serve as the open ends 10A. A plurality of thin conductive lines 12 is interposed between the conductor bases 10 and connected to the ends 10B, wherein their intermediate portions are equipped with the vias 13 interconnected to the ground layer G. Similarly, a pair of conductor bases 14 is juxtaposed via an interval therebetween in the length direction such that the side A and the side B of the current controller S2 serve as the open ends 10A. A plurality of thin conductive lines 16 is interposed between the conductor bases 14 and connected to the end 14B, wherein their intermediate portions are equipped with the vias 17 interconnected to the ground layer G.

In FIG. 7, the strings of the vias 13, 17 are shared by the thin conductive lines 12, 16 in the side A and the thin conductive lines 12, 16 in the side B, wherein the current controllers S1, S2 are arranged symmetrically to each other via the ground layer G. That is, the noise suppression structures, which are each designed to suppress an undesired high-frequency current i and which are equipped with the open ends 10A, 14A in both the side A and the side B, are arranged back-to-back via the ground layer G. Thus, even when an undesired high-frequency current i propagates from the side A to the side B, it is possible to suppress propagation of the undesired high-frequency current i due to high input impedances at the open ends 10A, 14A. Alternatively, when an undesired high-frequency current i propagates from the side B to the side A, it is possible to suppress propagation of the undesired high-frequency current i due to high input impedances at the open ends 10A, 14A. That is, it is possible to suppress undesired high-frequency currents i which may propagate from both the side A and the side B.

(Third Variation)

Figure 8:
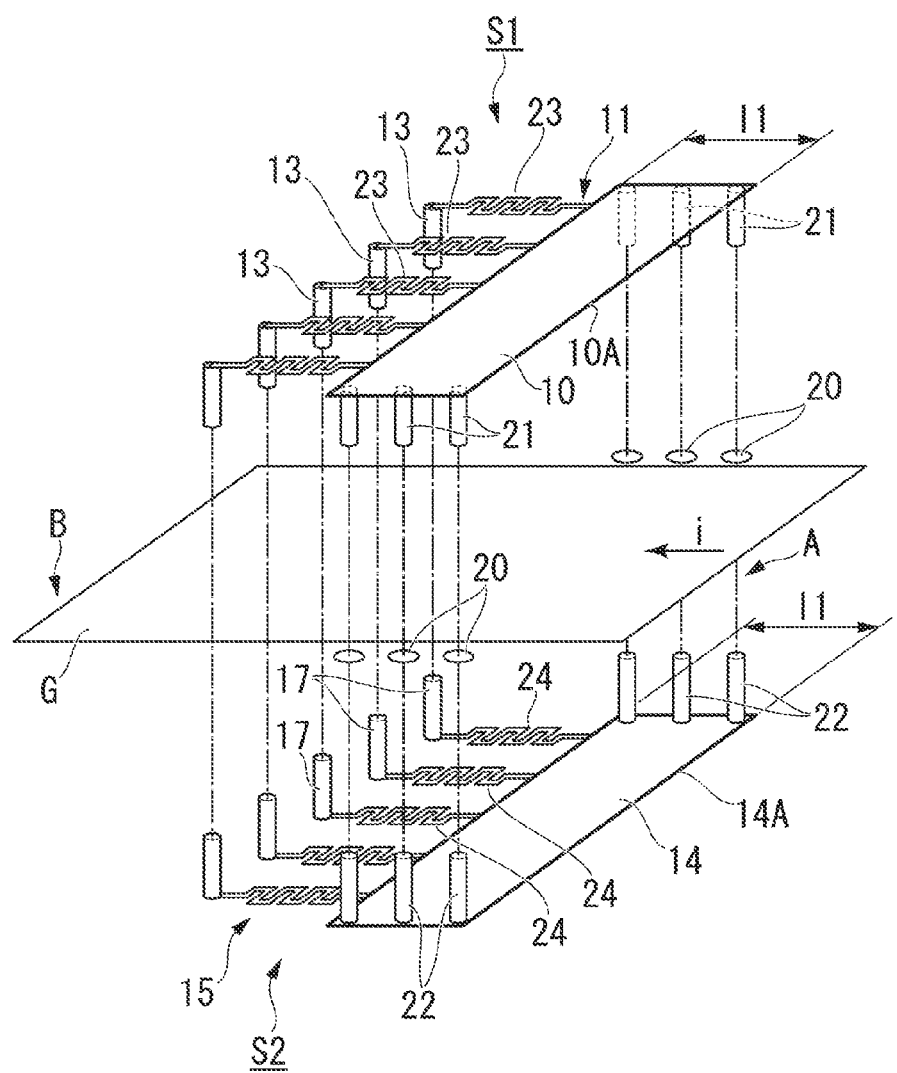
FIG. 8 An exploded view showing a noise suppression structure according to a third variation of the second embodiment, showing an example of arranging flat meandering wires.
Figure 9:
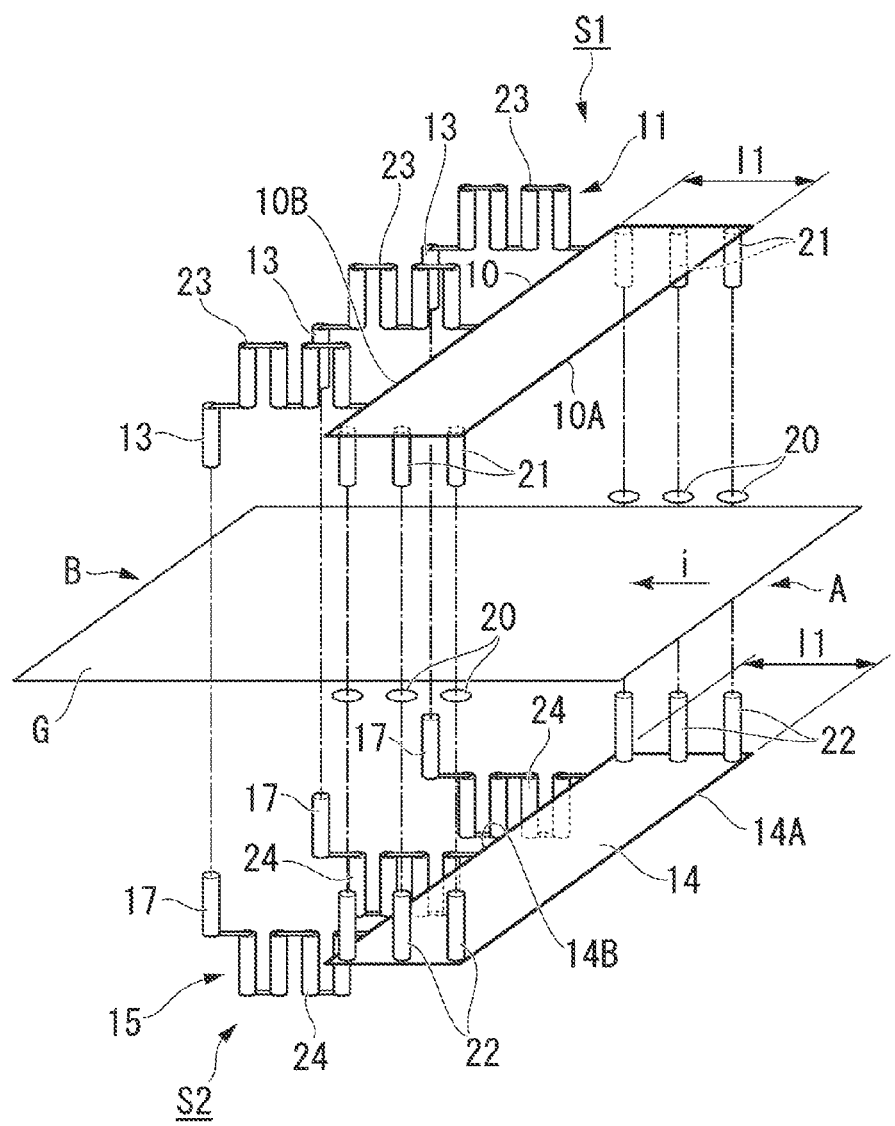
FIG. 9 An exploded view showing the noise suppression structure according to the third variation of the second embodiment, showing an example of arranging vertical meandering wires.

The second embodiment utilizes a plurality of thin conductive lines 12, 16 as the conductor short-circuiting parts 11, 15 of the current controllers S1, S2, but it is possible to utilize meandering wires 23, 24, which are partially or entirely shaped in a meandering manner as shown in FIGS. 8 and 9, thus further increasing an inductance.

FIG. 8 shows meandering flat wires 23, 24 which meander in the same planes as the conductor bases 10, 14. FIG. 9 shows vertical meandering wires 23, 24 which meander in the thickness directions of the conductor bases 10, 14. The vertical meandering wires 23, 24 can be formed such that the interlaminar portions thereof are folded back using a plurality of vias and wires.

The flat meandering wires 23, 24 shown in FIG. 8 are arranged in the same planes as the conductor bases 10, 14 of the current controllers S1, S2; but this is not a restriction. For example, as shown in FIG. 10, it is possible to form the meandering wires 23, 24 in different layers from the conductor bases 10, 14 of the current controllers S1, S2, wherein the meandering wires 23 are disposed just above the conductor base 10 while the meandering wires 24 are disposed just below the conductor base 14.

Figure 10:
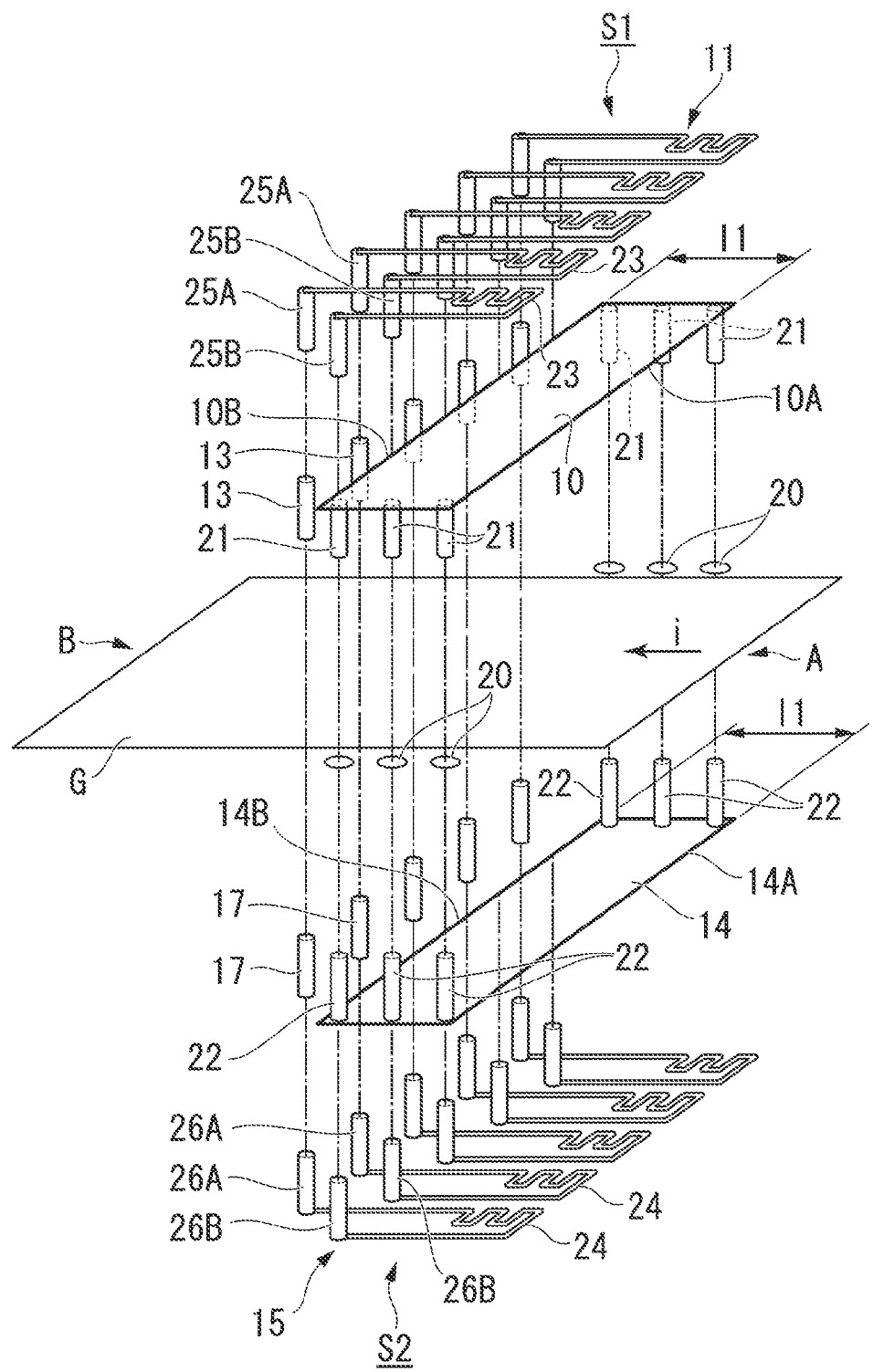
FIG. 10 An exploded view showing the noise suppression structure according to the third variation of the second embodiment, showing an example of forming flat meandering wires in a layer different from a conductor body.

As shown in FIG. 10, the current controller S1 is designed such that wires are pulled up to the upper layer by way of vias 25B at the end 10B, opposite to the open end 10A of the conductor base 10; they are shaped into the meandering wires 23 disposed just above the conductor base 10; subsequently, they are returned to the same plane as the conductor base 10 by way of vias 25A; furthermore, they are connected to the ground layer G by way of the vias 13. Additionally, the current controller S2 is designed such that wires are pulled up to the upper layer by way of vias 26B at the end 14B, opposite to the open end 14A of the conductor base 14; they are shaped into the meandering wires 24 disposed just above the conductor base 14; subsequently, they are returned to the same layer as the conductor base 14 by way of vias 26; furthermore, they are connected to the ground layer G by way of the vias 17. Compared to the constitution of FIG. 8 in which the meandering wires 23, 24 are arranged in the same planes as the current controllers S1, S2, the constitution of FIG. 10 makes it possible to miniaturize a printed wiring substrate in the length direction (i.e. the A-B direction) because the conductor bases 10, 14 may overlap with the meandering wires 23, 24 in the thickness direction.

(Fourth Variation)

Figure 11:
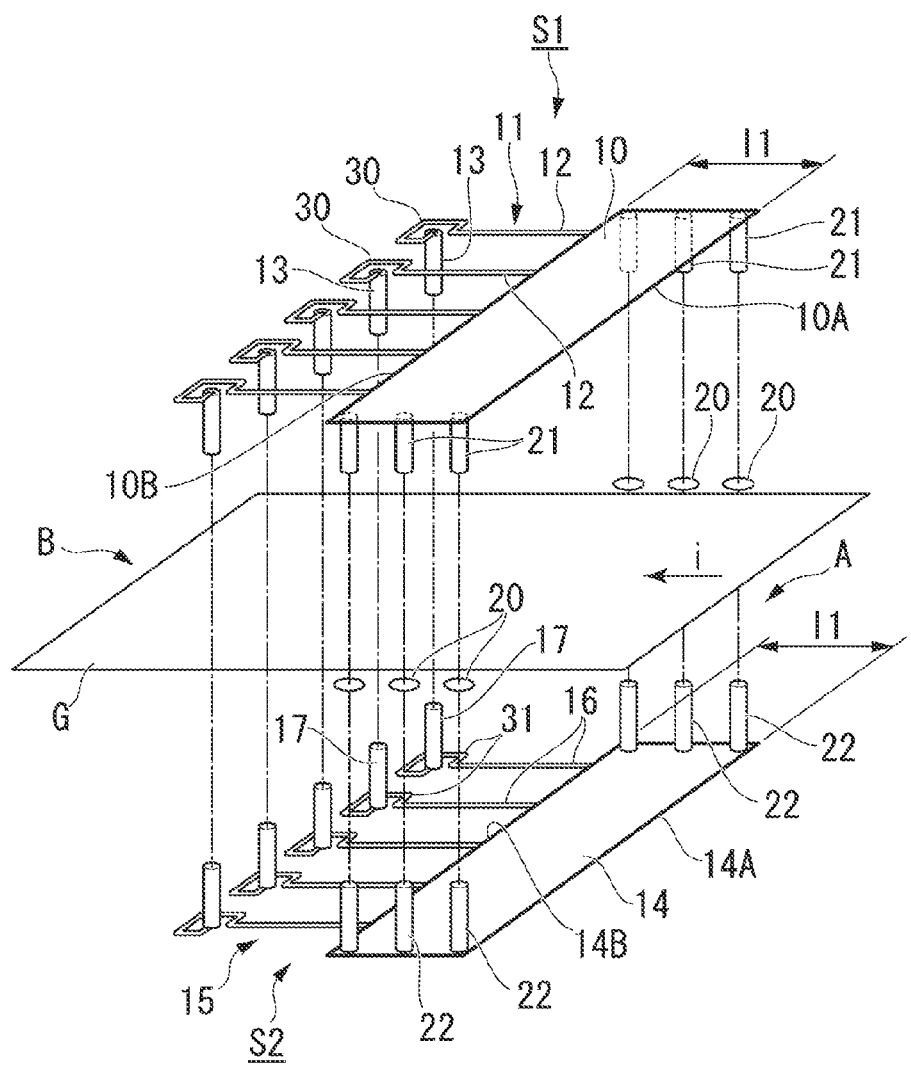
FIG. 11 An exploded view showing a noise suppression structure according to a fourth variation of the second embodiment.

The second embodiment is designed such that a plurality of thin conductive lines 12, 16 serve as the conductor short-circuiting parts 11, 15 of the current controllers S1, S2, but it is possible to utilize spiral wires 30, 31 which are partially or entirely formed in a spiral shape as shown in FIG. 11, wherein the spiral wires 30, 31 may be arranged in the same layers as the conductor bases 10, 14. Herein, the spiral wires 30, 31 constituting the conductor short-circuiting parts 11, 15 are each formed using a single layer such that the start-edges of the spiral wires 30, 31 are arranged in the periphery of the vias 13, 17; the spiral shapes are formed about their centers corresponding to the vias 13, 17; then, they are connected to the vias 13, 17.

(Fifth Variation)

Figure 12:
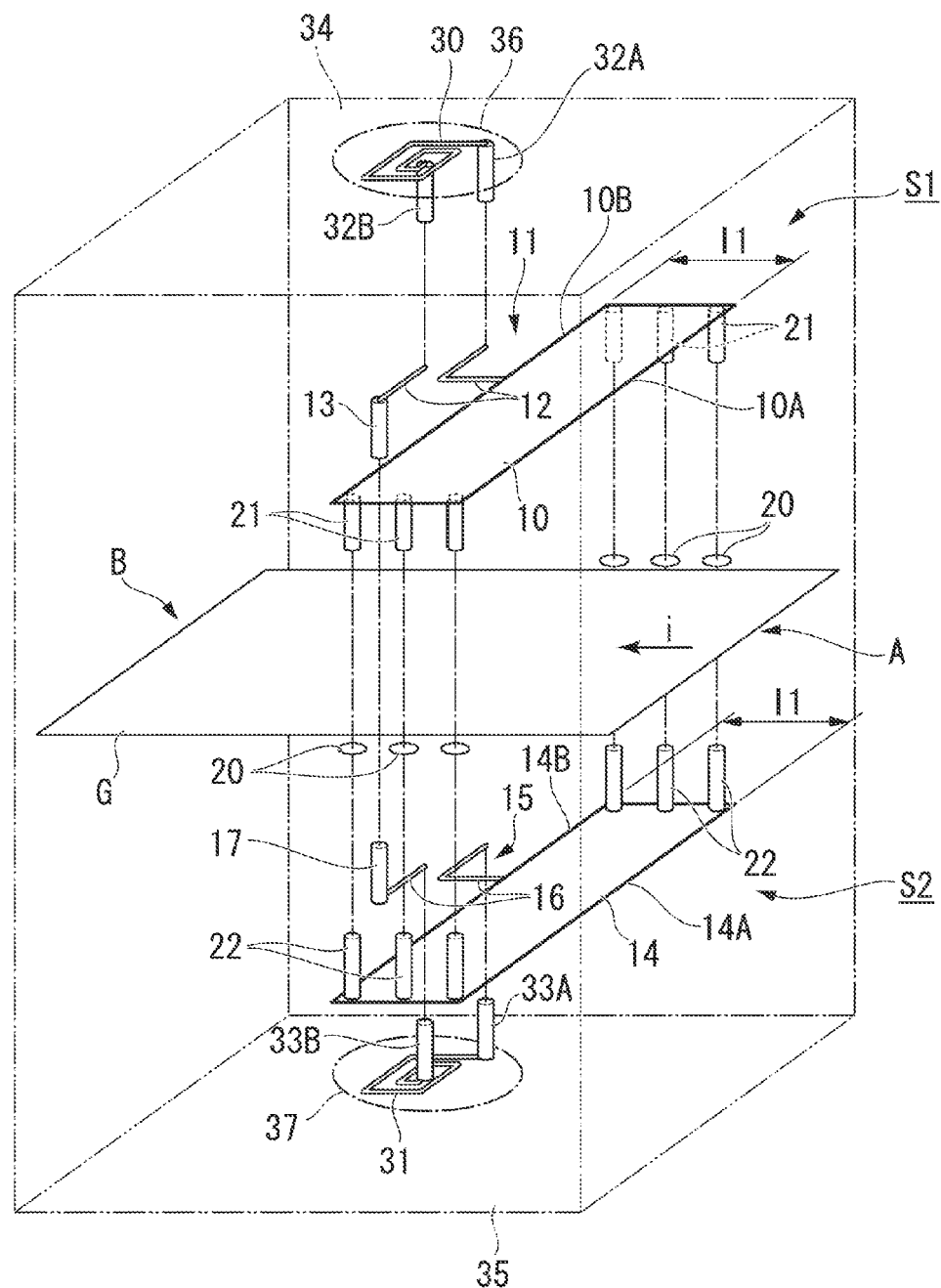
FIG. 12 An exploded view showing a noise suppression structure according to a fifth variation of the second embodiment.

The fourth variation of the second embodiment shown in FIG. 11 is designed such that the spiral wires 30, 31 are arranged in the same planes as the conductor bases 10, 14 in connection with the thin conductive wires 12, 16 of the conductor short-circuiting parts 11, 15; but this is not a restriction. It is possible to arrange the spiral wires 30, 31 in surface layers 34, 35, which are different layers from the conductor bases 10, 14, by way of vias 32A, 32B, 33A, 33B as shown in FIG. 12. At this time, magnetic materials 36, 37 are applied onto the spiral wires 30, 31 formed on the surface layers 34, 35 of a printed wiring substrate, thus increasing an inductance. As a result, it is possible to miniaturize the spiral wires 30, 31 by themselves. In this connection, the spiral wires 30, 31 may be replaced with meandering wires or thin conductive lines.

(Sixth Variation)

Figure 13:
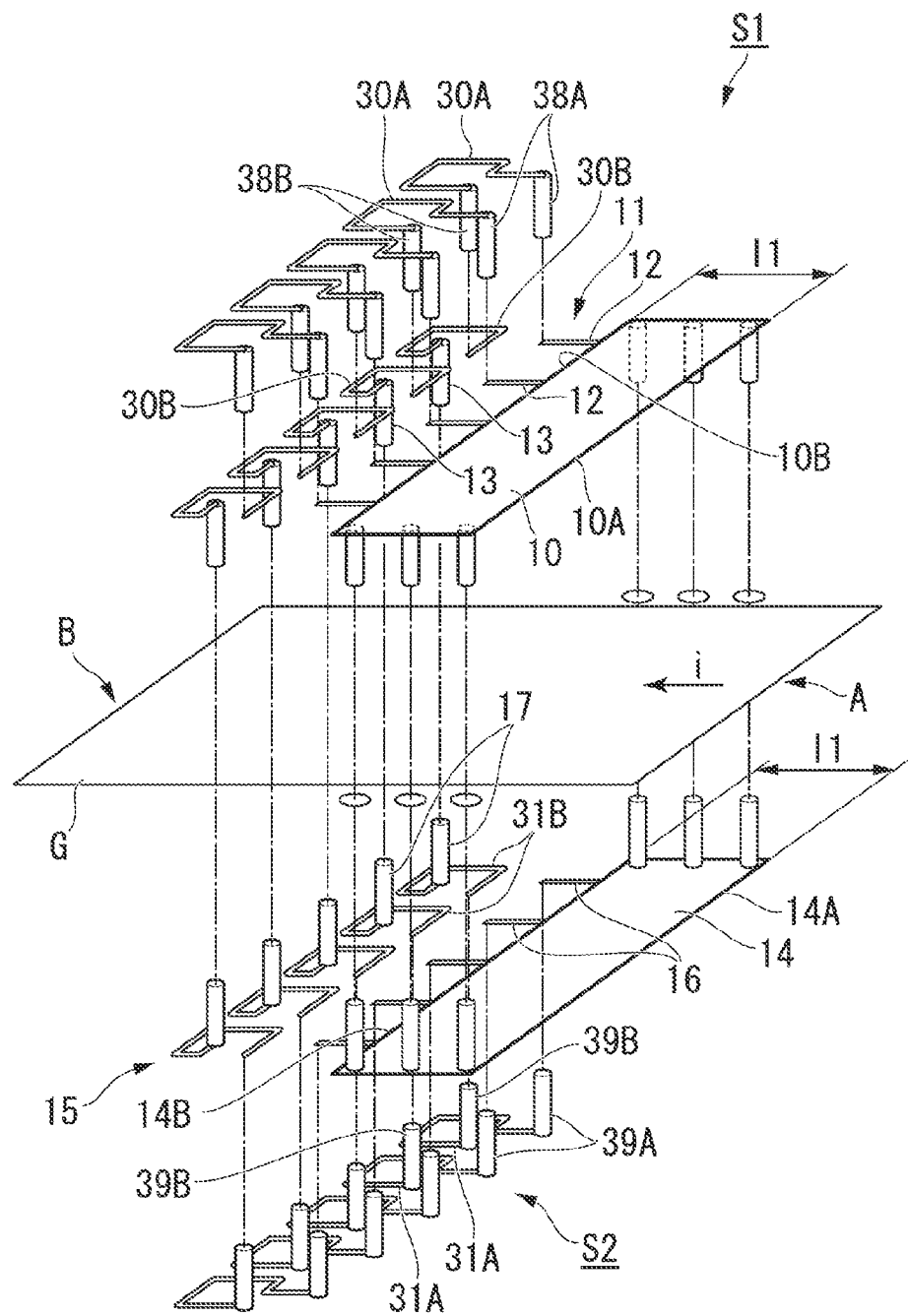
FIG. 13 An exploded view showing a noise suppression structure according to a sixth variation of the second embodiment.

In the fourth variation of the second embodiment shown in FIG. 11, the thin conductive lines 12, 16 of the conductor short-circuiting parts 11, 15 are equipped with the spiral wires 30, 31 which are formed in the same layers as the conductor bases 10, 14; but this is not a restriction. As shown in FIG. 13, it is possible to arrange two layers for the spiral wires 30, 31, i.e. spiral wires 30A, 30B and spiral wires 31A, 31B, which are connected to vias 38A, 38B and vias 39A, 39B.

In the current controller S1, the distal ends of the thin conductive lines 12, pulled out from the end 10B of the conductor base 10, are connected in series to the vias 38A, the spiral wires 30A, the vias 38B, the spiral wires 30B, and the vias 13 which are connected to the ground layer G. Similarly, in the current controller S2, the distal ends of the thin conductive lines 16, pulled out from the end 14B of the conductor base 14, are connected in series to the vias 39A, the spiral wires 31A, the vias 39B, the spiral wires 31B, and the vias 17 which are connected to the ground layer G.

(Seventh Variation)

Figure 14:
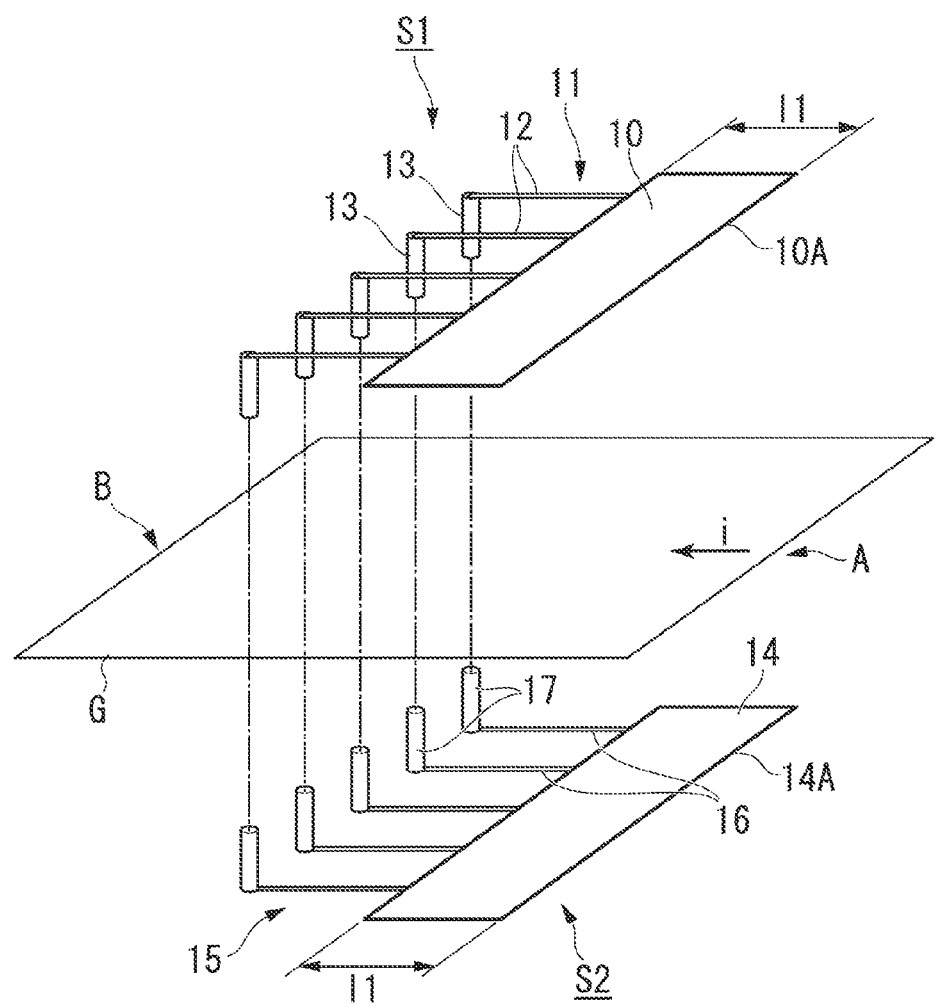
FIG. 14 An exploded view showing a noise suppression structure according to a seventh variation of the second embodiment.

In the noise suppression structure of the second embodiment shown in FIG. 4, the current controllers S1, S2 are connected to the conductor bases 10, 14 by way of the vias 21, 22; but it is possible to preclude the vias 21, 22 as shown in FIG. 14.

That is, the noise suppression structure precluding the vias 21, 22, as shown in FIG. 14, is able to suppress an undesired high-frequency current i which may propagates through the ground layer G from the side A to the side B.

Third Embodiment

Figure 15:
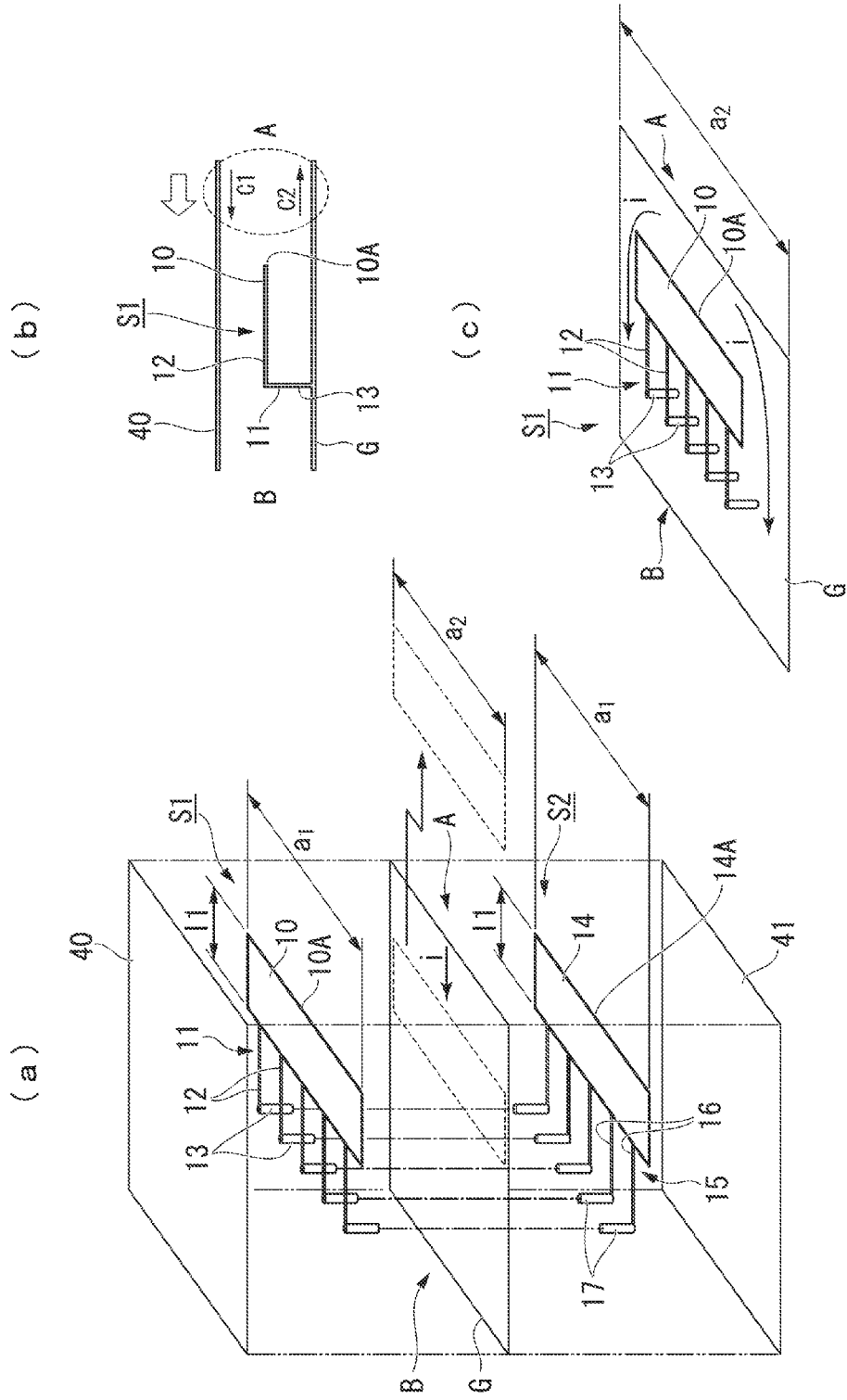
FIG. 15 (a) An exploded view of a noise suppression structure according to a third embodiment of the present invention; (b) an illustration showing the relationship between a ground current and a source current of an undesired high frequency in a current controller; (c) a perspective view showing the leakage of an undesired high-frequency current on condition that the width of a ground layer is larger than the width of a current controller.

Next, a noise suppression structure according to a third embodiment of the present invention will be described with reference to FIGS. 15($a$)-($c$). It is characterized in that the noise suppression structure of the third embodiment is interposed between an upper power layer 40 and a lower power layer 41. Herein, the current controllers S1, S2 shown in FIG. 14 are arranged in relation to the upper power layer 40 and the lower power layer 41 sandwiching the ground layer G.

The current controllers S1, S2 include the rectangular conductor bases 10, 14, which are laid in parallel to the ground layer G, and the conductor short-circuiting parts 11, 15 which are extended to the ground layer G from the conductor bases 10, 14, wherein the open ends 10A, 14A are arranged for the conductor bases 10, 14 in the side A. The conductor short-circuiting parts 11, 15 include a plurality of thin conductive lines 12, 16 and a plurality of vias 13, 17. It is possible to increase an inductance by interposing a plurality of thin conductive lines 12, 16. In this connection, the current controllers S1, S2 preclude the vias 21, 22 shown in FIG. 4.

The operation of the current controller S1 including the ground layer G will be described with reference to FIG. 15($b$). The following description refers to the operation of the current controller S1 alone because the current controller S2 has the same operation as the current controller S1.

In response to an undesired high-frequency source current C1 flowing through the power layer 40, an undesired high-frequency ground current C2 serving as a return current flows in an opposite direction to the source current C1. When a pair of the undesired high-frequency source current C1 and the ground current C2 flows in a direction from the side A to the side B, an input impedance at the open end 10A increases owing to the current controller S1 (which are constituted of the via connected to the ground layer G, the thin conductive lines 12, and the conductor base 10 whose length is shorter than a quarter wavelength of an undesired high-frequency current), thus suppressing the undesired high-frequency ground current C2 and thereby reducing an undesired high-frequency current.

In FIG. 15(a), it is possible to improve a reduction effect of an undesired high-frequency current in the relationship of "a1≥a2" between the width a1 of the conductor bases 10, 14 of the current controllers S1, S2 and the width a2 of the ground layer G disposed opposite to the conductor bases 10, 14. This is because the other relationship of "a1<a2" may form a bypass circuit that allows an undesired high-frequency current i to flow in the ground layer G as shown in FIG. 15(c), thus reducing a reduction effect of an undesired high-frequency current i propagating from the side A to the side B.

A similar explanation can be made with respect to the lower constitution including the ground layer G. Thus, it is possible to reduce an undesired high-frequency current of a radio frequency which may leak from the digital circuit 103 and then propagate through the power layer 40 and the ground layer G in a mobile wireless terminal including the wireless circuit 102 on the side B and the digital circuit 103 on the side A, wherein it is possible to further improve the radio communication quality of a mobile wireless terminal by way of suppression of an undesired high-frequency current i entering into the wireless circuit 102 disposed on the side B.

In the aforementioned current controller S1, the conductor short-circuiting part 11 connected to the rectangular conductor base 10, which is arranged in parallel to the ground layer G, is made up of a plurality of thin conductive lines 12 increasing an inductance, wherein it is possible to reduce the length of the conductor base 10 to be shorter than a quarter wavelength (λ/4) of an undesired high-frequency current i flowing through the ground layer G, and therefore it is possible to shorten the entire length of the current controller S1.

As described above, it is possible to reduce the lengths of the current controllers S1, S2 in a mobile wireless terminal adopting the noise suppression structure of the third embodiment, in which the conductor short-circuiting parts 11, 15 proximate to the terminal end is made up of the thin conductive lines 12, 16 increasing an inductance in the current controllers S1, S2 of the short-circuited termination type; thus, it is possible to miniaturize a mobile wireless terminal.

(First Variation)

Figure 16:
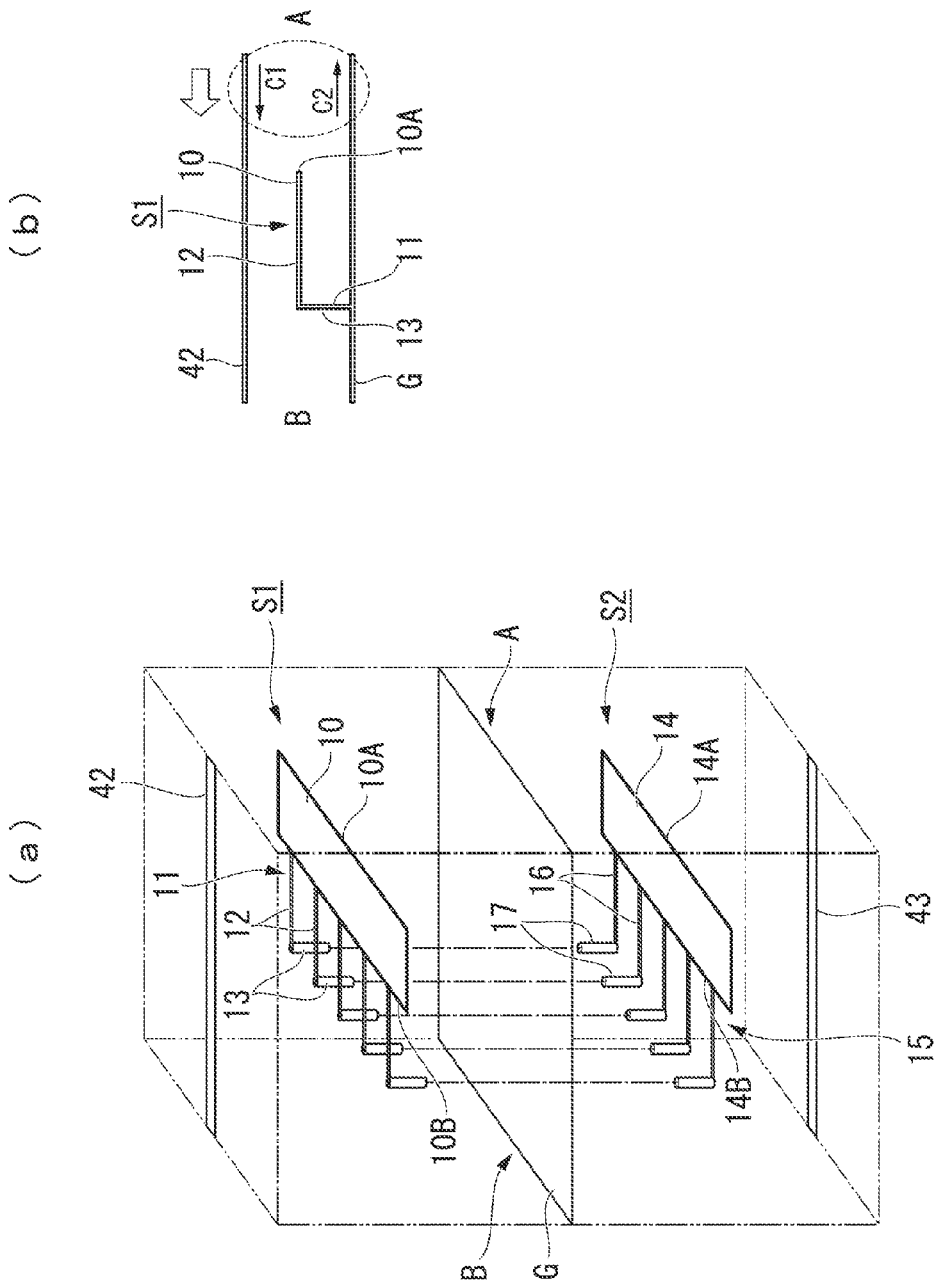
FIG. 16 (a) An exploded view of a noise suppression structure according to a first variation of the third embodiment; (b) an illustration showing the relationship between a ground current and a source current of an undesired high frequency in a current controller.

The third embodiment is designed such that the current controllers S1, S2 are arranged in relation to the upper power layer 40 and the lower power layer 41 sandwiching the ground layer G; but this is not a restriction. As shown in FIG. 16(a), (b), it is possible to arrange the current controllers S1, S2 in relation to an upper signal line 42 and a lower signal line 43 sandwiching the ground layer G. The signal lines 42, 43 transmit signals in the A-B direction, wherein it is possible to increase input impedances at the open ends 10A, 14A by means of the current controllers S1, S2 including the conductor bases 10, 14 whose lengths are shorter than a quarter wavelength of an undesired high-frequency current as similar to the third embodiment shown in FIG. 15(a), (b), thus reducing an undesired high-frequency current. A similar explanation can be made with respect to the lower constitution including the ground layer G. Thus, it is possible to further improve the radio communication quality of a mobile wireless terminal because of a reduction of an undesired high-frequency current i entering into the wireless circuit 102 disposed on the side B.

(Second Variation)

Figure 17:
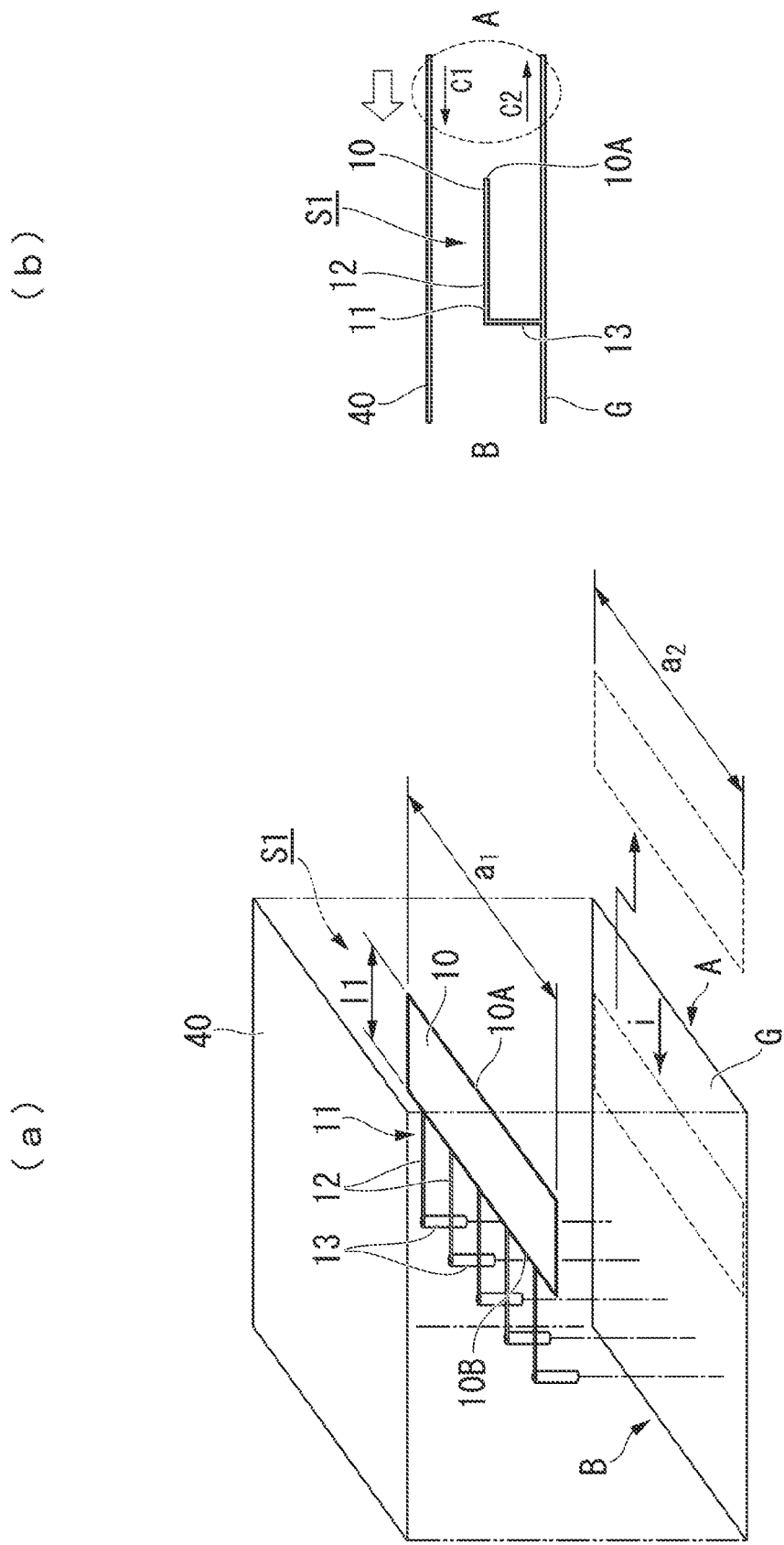
FIG. 17 (a) An exploded view of a noise suppression structure according to a second variation of the third embodiment; (b) an illustration showing the relationship between a ground current and a source current of an undesired high frequency in a current controller.

The third embodiment is designed such that the current controllers S1, S1 are arranged in relation to the upper power layer 40 and the lower power layer 41 sandwiching the ground layer G; but this is not a restriction. As shown in FIG. 17(a), (b), it is possible to solely arrange the current controller S1 between the upper power layer 40 and the ground layer G, thus suppressing an undesired high-frequency current entering into the wireless circuit 102 disposed on the side B. In contrast, it is possible to solely arrange the current controller S2 between the lower power layer 41 and the ground layer G.

In FIG. 17(a), it is possible to improve a suppression effect of an undesired high-frequency current in the relationship of "a1≥a2" between the width a1 of the conductor base 10 of the current controller S1 and the width a2 of the ground layer G disposed opposite to the conductor base 10. This is because the other relationship of "a1<a2" may form a bypass circuit that allows a noise current i to flow through the ground layer G, thus decreasing a reduction effect of a noise current i propagating in the direction from the side A to the side B.

(Third Variation)

Figure 18:
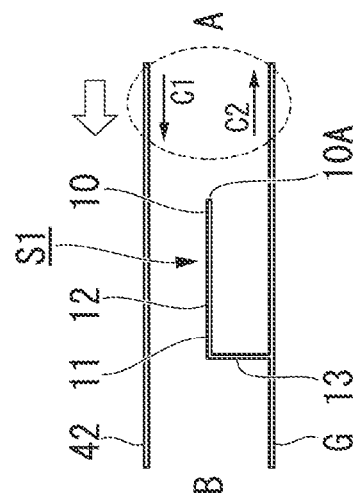
FIG. 18 (a) An exploded view of a noise suppression structure according to a third variation of the third embodiment; (b) an illustration showing the relationship between a ground current and a source current of an undesired high frequency in a current controller.
Figure 18:
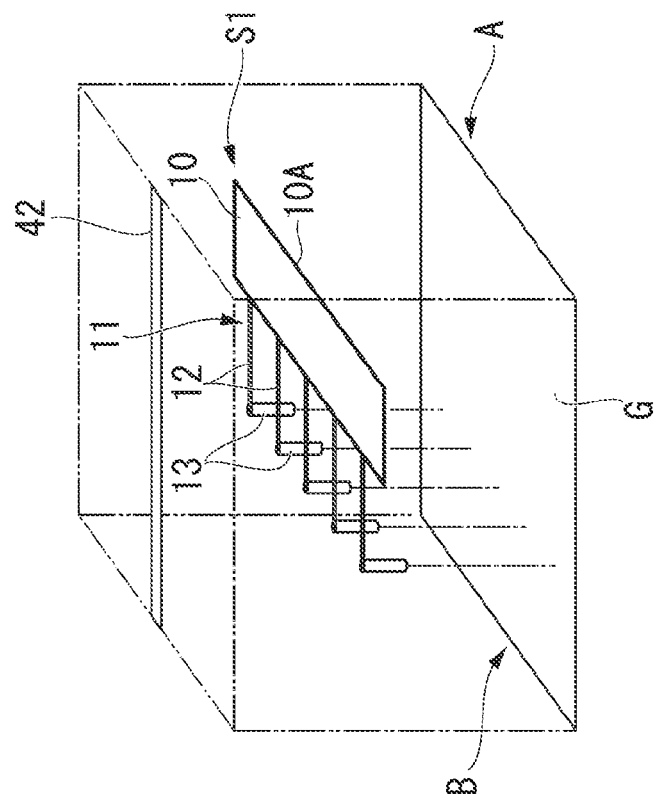

The first variation of the third embodiment is designed such that the current controllers S1, S2 are arranged in relation to the upper signal line 42 and the lower signal line 43 sandwiching the ground layer G; but this is not a restriction. As shown in FIG. 18(a), (b), it is possible to solely arrange the current controller S1 between the upper signal line 42 and the ground layer G, thus suppressing an undesired high-frequency current i entering into the wireless circuit 102 disposed on the side B. In contrast, it is possible to solely arrange the current controller S2 between the lower signal line 43 and the ground layer G.

Additionally, the current controllers S1, S2 according to the third embodiment may be modified as follows. That is, it is possible to connect the conductor short-circuiting parts 11, 15 to the ground layer G by way of single thin conductive lines 12, 16 and single vias 13, 17 as shown in FIG. 6. As shown in FIG. 7, it is possible to modify the current controllers S1, S1 such that a pair of the conductor bases 10, 14 is separated with an interval therebetween in the length direction; a plurality of thin conductive lines 12, 16 is interposed between the conductor bases 10, 14; and the vias 13, 17 connected to the ground layer G are applied to the intermediate parts of the conductor bases 10, 14. Additionally, it is possible to partially or entirely reshape the thin conductive lines 12, 16 as the meandering wires 23, 24, thus further increasing an inductance. At this time, it is possible to arrange the meandering flat wires 23, 24, shown in FIG. 8, in the same planes as the conductor bases 10, 14, or it is possible to arrange the meandering vertical wires 23, 24, shown in FIG. 9, in the thickness direction of the conductor bases 10, 14.

As shown in FIG. 10, it is possible to modify the current controllers S1, S2 such that wires are pulled out into the other layers by way of the vias 25A, 25B at the ends 10B, 14B opposite to the open ends 10A, 14A of the conductor bases 10, 14; they are shaped into the meandering wires 23, 24 disposed just above/below the conductor bases 10, 14; subsequently, they are returned to the same layers as the conductive bases 10, 14; furthermore, they are connected to the ground layer G by way of the vias 13, 17. Alternatively, it is possible to modify the current controllers S1, S2 as shown in FIG. 11 such that the thin conductive lines 12, 16 of the conductor short-circuiting parts 11, 15 are partially or entirely reshaped into the spiral wires 30, 31. Moreover, it is possible to form the spiral wires 30, 31 in the surface layers 34, 35, which are different layers from the conductive bases 10, 14, by way of the vias 32A, 32B and the vias 33A, 33B as shown in FIG. 12. At this time, it is possible to apply the magnetic substances 36, 37 onto the spiral wires 30, 31 formed on the surface layers 34, 35 of a printed wiring substrate, thus increasing an inductance. Alternatively, it is possible to form the two-layered spiral wires 30A, 30B and 31A, 31B, which are connected to the vias 38A, 38B and 39A, 39B.

Fourth Embodiment

Next, a noise suppression structure according to a fourth embodiment of the present invention will be described with reference to FIGS. 19 to 27.

The second embodiment shown in FIGS. 4 to 14 arranges the current controllers S1, S2 in the upper and lower layers sandwiching the ground layer G, whilst the fourth embodiment is characterized in that the current controller S1 is solely arranged on one side of the ground layer G (e.g. the upper side).

Figure 19:
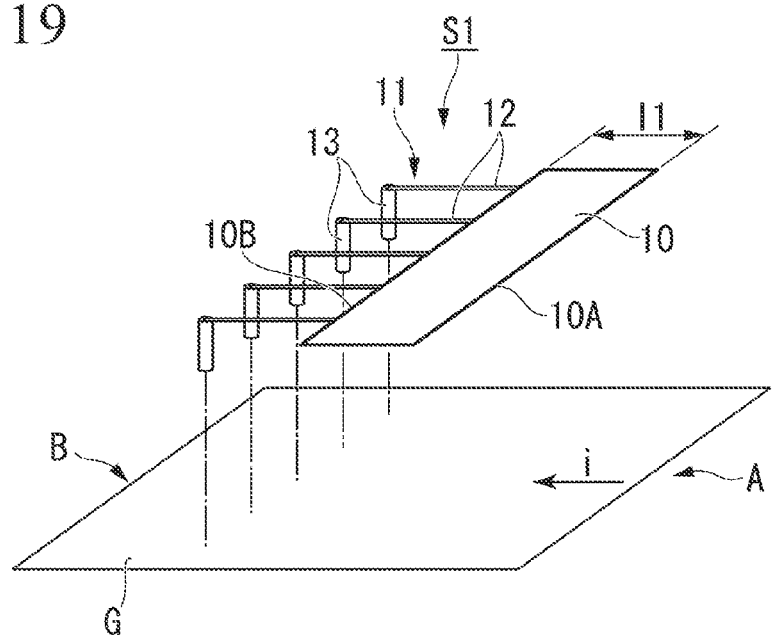
FIG. 19 An exploded view of a noise suppression structure according to a fourth embodiment of the present invention.

As shown in FIG. 19, the length of the conductor base 10 is shorter than a quarter wavelength ($\lambda/4$) of an undesired high-frequency current i flowing through the ground layer G; the current controller S1 includes the rectangular conductor base 10, which is arranged in parallel to the ground layer G, and the conductor short-circuiting part 11, which is extended to the ground layer G from the conductor base 10; and the open end 10A is disposed on the side A of the conductor base 10. The conductor short-circuiting part 11 includes a plurality of thin conductive lines 12, which are connected to the end 10B opposite to the open end 10A of the conductor base 10, and a plurality of vias 13 which connect the thin conductive lines 12 to the ground layer G, thus increasing an inductance by interposing a plurality of thin conductive lines 12.

In FIG. 19, the current controller S1 is positioned such that the open end 10A is directed to the side A while the conductor short-circuiting part 11 connected to the ground layer G is directed to the side B when an undesired high-frequency current (i.e. a noise current) i of a radio frequency, which should be suppressed, propagates from the side A to the side B. Thus, it is possible to suppress an undesired high-frequency current i, which flows through the ground layer G on the side A, from propagating at the open end 10A of the current controller S1, thus reducing an undesired high-frequency current i reaching the side B. As a result, it is possible to reduce an undesired high-frequency current i of a radio frequency, which leaks from a digital circuit and propagates through the ground layer G of a printed wiring substrate of a mobile wireless terminal including a wireless circuit and a digital circuit. It is possible to further improve the radio communication quality of a mobile wireless terminal due to a suppression of an undesired high-frequency current i entering into the wireless circuit.

The noise suppression structure of the fourth embodiment adopts the thin conductive lines 12 serving as the conductor short-circuiting part 11, proximate to the terminal end of the current controller S1 of a short-circuited termination type, so as to increase the inductance thereof, thus reducing the length of the current controller S1 and thereby miniaturize the entirety of a mobile wireless terminal.

(First Variation)

Figure 20:
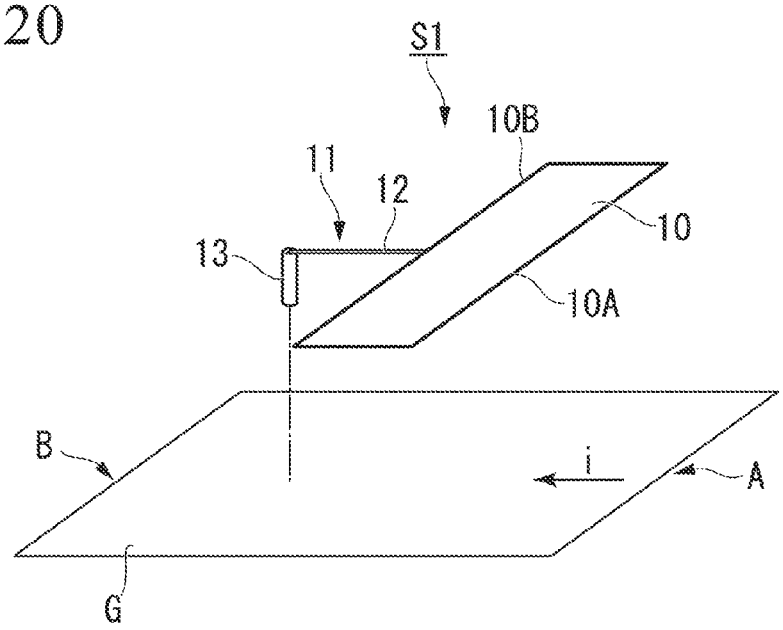
FIG. 20 An exploded view of a noise suppression structure according to a first variation of the fourth embodiment.

The fourth embodiment adopts a plurality of thin conductive lines 12 serving as the conductor short-circuiting part 11 of the current controller S1; but this is not a restriction. It is possible to form the conductor short-circuiting part 11 using a single thin conductive line 12 and a single via 13, which are connected to the ground layer G as shown in FIG. 20.

(Second Variation)

Figure 21:
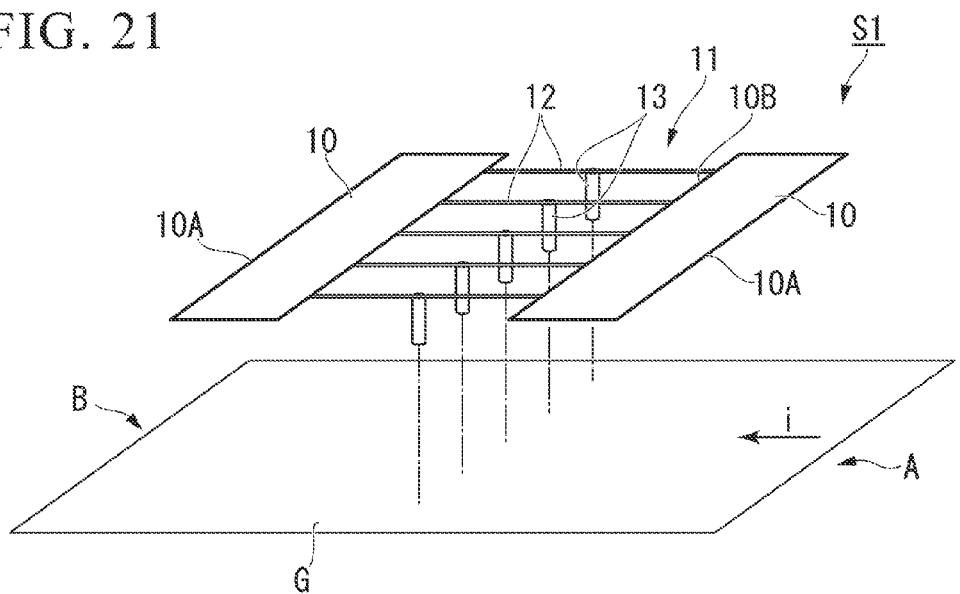
FIG. 21 An exploded view of a noise suppression structure according to a second variation of the fourth embodiment.

It is possible to redesign the current controller S1 of the fourth embodiment by using the constitution shown in FIG. 21. That is, it is possible to redesign the current controller S1 such that a pair of conductor bases 10 is juxtaposed with an interval therebetween in the length direction; a plurality of thin conductive lines 12 is interposed between the conductor bases 10; the vias 13 are arranged to interconnect the intermediate portions to the ground layer G. Using this noise suppression structure, sharing a string of vias 13, with the open ends 10A and 10B on the side A and the side B, it is possible to suppress an undesired high-frequency current i, propagating from the side A to the side B, due to high input impedance at the open end 10A disposed on the side A. Additionally, it is possible to suppress an undesired high-frequency current i, propagating from the side B to the side A, due to high input impedance at the open end 10A disposed on the side B. That is, it is possible to suppress an undesired high-frequency current i propagating from both the side A and the side B.

(Third Variation)

Figure 22:
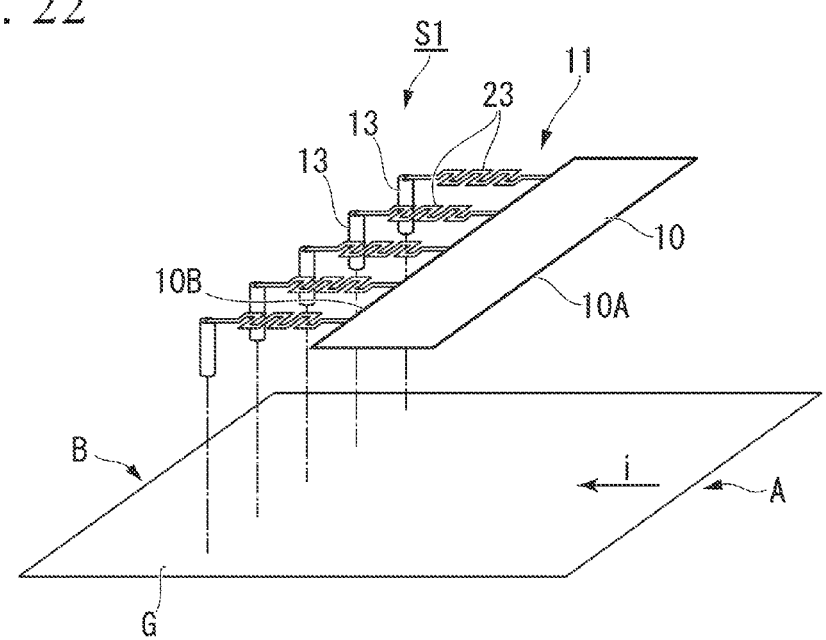
FIG. 22 An exploded view of a noise suppression structure according to a third variation of the fourth embodiment, showing an example of arranging meandering flat wires.

It is possible to redesign the current controller S1 of the fourth embodiment by using the constitution shown in FIG. 22. That is, it is possible to partially or entirely reshape a plurality of thin conductive lines 12, arranged in the conductor short-circuiting part 11 of the current controller S1, as the meandering wires 23, thus further increasing an inductance.

Figure 23:
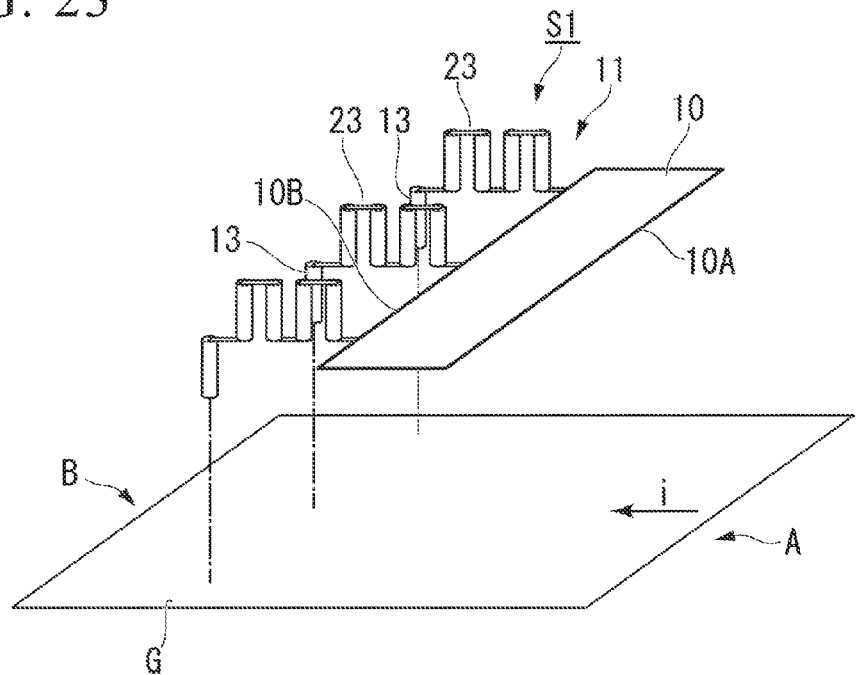
FIG. 23 An exploded view of the noise suppression structure according to the third variation of the fourth embodiment, showing an example of arranging meandering vertical wires.

At this time, it is possible to form the meandering flat wires 23 in the same plane as the conductor base 10 as shown in FIG. 22, or it is possible to form the meandering vertical wires 23 in the thickness direction of the conductor base 10 as shown in FIG. 23. The meandering vertical wires 23 are formed such that the interlaminar portions thereof are folded back using a plurality of vias and wires.

(Fourth Variation)

Figure 24:
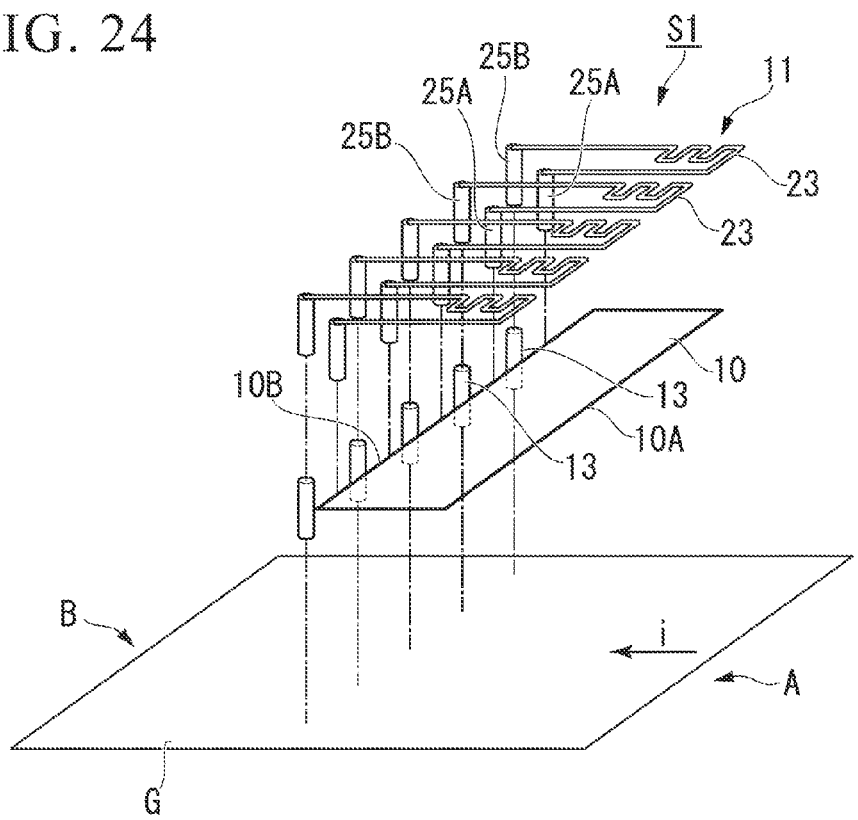
FIG. 24 An exploded view of a noise suppression structure according to a fourth variation of the fourth embodiment.

It is possible to redesign the current controller S1 of the fourth embodiment by using the constitution shown in FIG. 24. That is, it is unnecessary to limit the meandering flat wires 23 as ones formed in the same plane as the conductive base 10 of the current controller S1 shown in FIG. 22. It is possible to form the meandering wires 23 just above the conductor base 10 in a different layer from the conductor base 10 of the current controller S1.

Specifically, it is possible to design the current controller S1 such that wires are pulled out into another layer by way of the vias 25A at the end 10B opposite to the open end 10A of the conductor base 10; they are reshaped into the meandering wires 23 disposed just above the conductor base 10; subsequently, they are returned to the same layer as the conductor base 10 by way of the vias 25B; furthermore, they are connected to the ground layer G by way of the vias 13. Compared to the constitution of FIG. 22 in which the meandering wires 23 are formed in the same layer as the conductor base 10 of the current controller S1, it is possible to further miniaturize a printed wiring substrate in the length direction (i.e. the A-B direction) with the constitution of FIG. 24.

(Fifth Variation)

Figure 25:
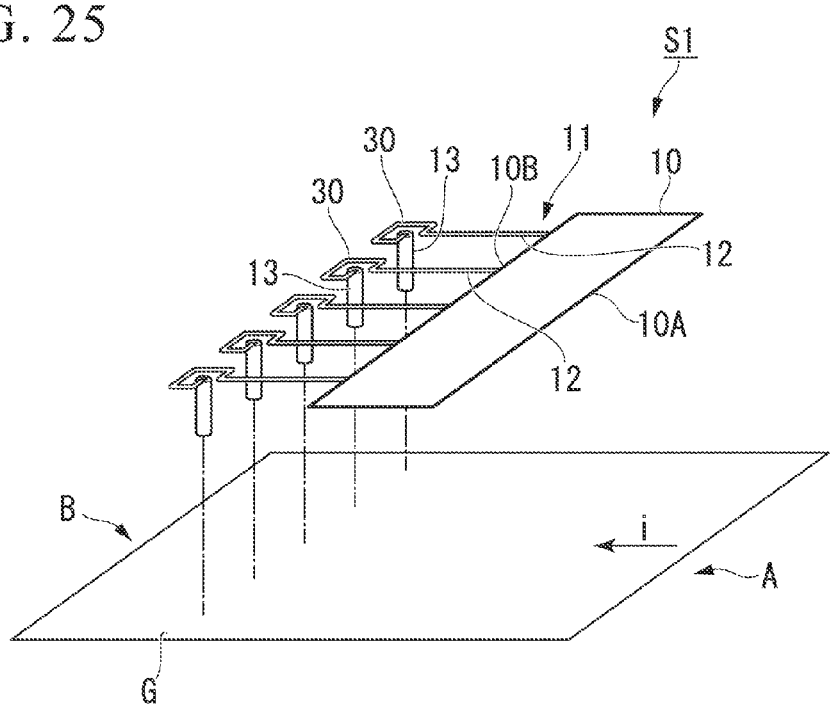
FIG. 25 An exploded view of a noise suppression structure according to a fifth variation of the fourth embodiment.

It is possible to redesign the current controller S1 of the fourth embodiment by using the constitution shown in FIG. 25. That is, it is possible to partially or entirely reshape the thin conductive lines 12 of the current controller S1 into the spiral wires 30, which are formed in the same layer as the conductor base 10. At this time, the start-edges of the spiral wires 30 are arranged in the periphery of the vias 13 and wound about the centers of the vias 13 in a spiral manner, whereby it is possible to realize the spiral wires 30 of the conductor short-circuiting part 11 in a single layer.

(Sixth Variation)

Figure 26:
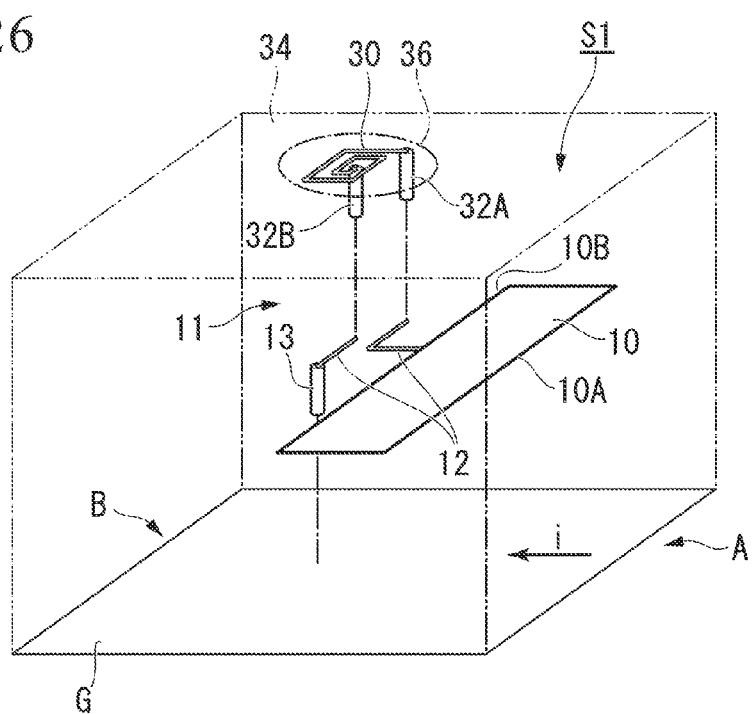
FIG. 26 An exploded view of a noise suppression structure according to a sixth variation of the fourth embodiment.

It is possible to redesign the current controller S1 of the fourth embodiment by using the constitution shown in FIG. 26. In FIG. 25, the spiral wires 30 of the current controller S1 are formed in the same layer as the conductor base 10; but this is not a restriction. It is possible to form the spiral wires 30 in the surface layer 34, which is a different layer from the conductor base 10, by way of the vias 32A, 32B. At this time, it is possible to apply the magnetic substances 36 onto the spiral wires 30 formed on the surface layer 34 of a printed wiring substrate, thus increasing an inductance. As a result, it is possible to miniaturize the spiral wires 30 by themselves. In this connection, it is possible to replace the spiral wires 30 with meandering wires or thin conductive wires.

(Seventh Variation)

Figure 27:
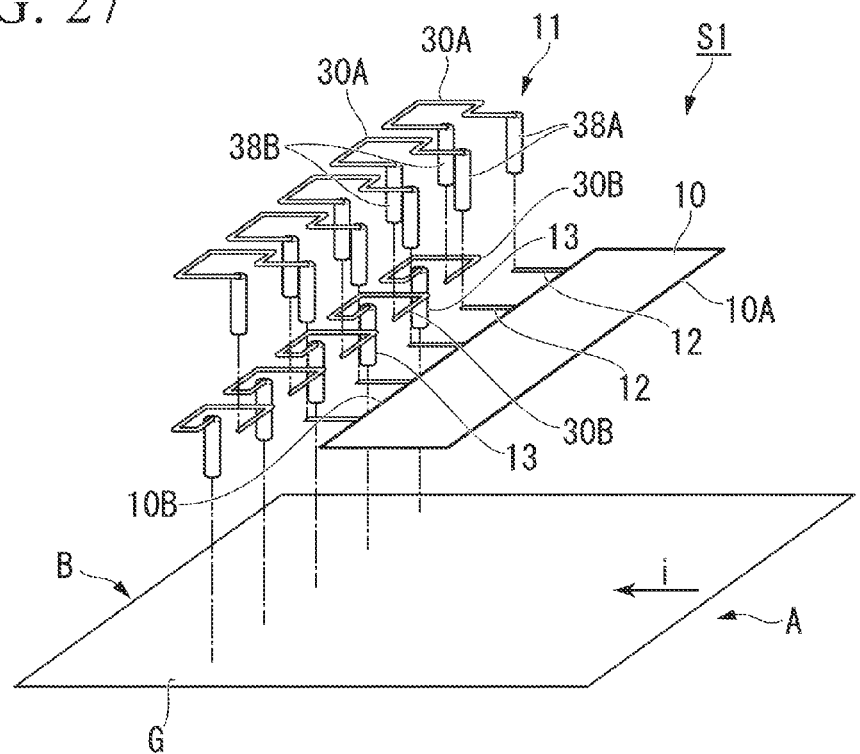
FIG. 27 An exploded view of a noise suppression structure according to a seventh variation of the fourth embodiment.
Figure 28:
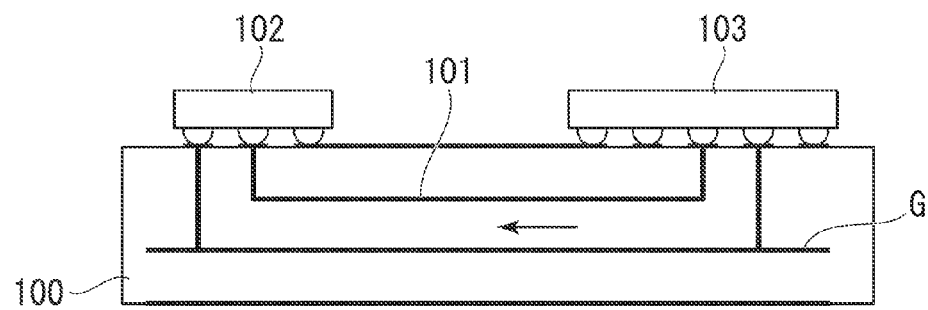
FIG. 28 A sectional view showing the overview structure of a printed wiring substrate in the conventional mobile wireless terminal including a wireless circuit and a digital circuit.

It is possible to redesign the current controller S of the fourth embodiment by using the constitution shown in FIG. 27. That is, it is possible to arrange the two-layered spiral wires 30A, 30B, in the thin conductive lines 12 of the conductor short-circuiting part 11, and connect them to the vias 38A, 38B. In the current controller S1, it is possible to connect the distal ends of the thin conductive lines 12, which are pulled out from the end 10B of the conductor base 10, to the vias 38A, the spiral wires 30A, the vias 38B, the spiral wires 30B, and the vias 13 which are connected to the ground layer G.

The noise suppression structure of the present invention has been described with reference to the foregoing embodiments; but the specific constitution of the noise suppression structure is not necessarily limited to the foregoing embodiments. Additionally, various wiring patterns are illustrated as variations of the foregoing embodiments, but it is possible to appropriately combine them as long as wiring patterns can increase an inductance of a conductor short-circuiting part.

Thus, it is possible to realize the present invention by way of various design changes which fall within the scope of the invention defined in the appended claims. Specifically, it is possible to provide the following constitutions.

(1) A noise suppression structure including plural pairs of thin conductive lines and vias forming conductor short-circuiting parts.

(2) A noise suppression structure including spiral wires in a different layer from a conductor base.

(3) A noise suppression structure including spiral wires formed on the surface layer of a printed wiring substrate and applied with magnetic substances thereon.

(4) A noise suppression structure with thin conductive lines including meandering wires.

(5) A noise suppression structure including meandering wires in a different layer from a conductor base.

(6) A noise suppression structure in which a power layer is disposed opposite to a ground layer and in which a current controller is interposed between the power layer and the ground layer.

(7) A noise suppression structure in which signal lines are positioned opposite to a ground layer and in which a current controller is interposed between the signal lines and the ground layer.

INDUSTRIAL APPLICABILITY

The present invention is preferably applicable to a mobile wireless terminal requiring miniaturization and design to reduce an undesired high-frequency current (i.e. a noise current) flowing between a wireless circuit and a digital circuit, thus suppressing an electromagnetic interference.

REFERENCE SIGNS LIST 1 sleeve
2 conductor base
3 conductor short-circuiting part
4 linear conductor
10 conductor base
11 conductor short-circuiting part
12 thin conductive line
13 via
14 conductor base
15 conductor short-circuiting part
16 thin conductive line
17 via
21, 22 via
23, 24 meandering wire
25A, 25B via
26A, 26B via
30, 31 spiral wire
32A, 32B via
33A, 33B via
34, 35 surface layer
36, 37 magnetic substance
38A, 38B via
39A, 39B via
40, 41 power layer
42, 43 signal line
100 printed wiring substrate
101 signal wire/power layer
102 wireless circuit
103 digital circuit
110 balanced antenna
111 coaxial line
111A outer conductor
111B inner conductor
112 short-circuiting plane
113 cylindrical sleeve
G ground layer
S, S1, S2 current controller

The invention claimed is:

1. A noise suppression structure of a short-circuited termination type for suppressing an undesired high-frequency current flowing through a ground layer of a printed wiring substrate, the noise suppression structure, comprising:
a conductor base disposed apart from the ground layer with an interval in a thickness direction; and
a conductor short-circuiting part which is connected to the ground layer at a position opposite to an open end of the conductor base, the conductor short-circuiting part having an inductance greater than an inductance of the conductor base,
wherein the conductor short-circuiting part includes a plurality of thin conductive lines connected to the conductor base, and a plurality of vias connected between the plurality of thin conductive lines and the ground layer.

2. The noise suppression structure according to claim 1, wherein the plurality of thin conductive lines include meandering wires or spiral wires.

3. A noise suppression structure of a short-circuited termination type for suppressing an undesired high-frequency current flowing through a transmission line, the noise suppression structure comprising:
a conductor base configured to encompass a periphery of the transmission line; and
a conductor short-circuiting part connected to the transmission line at a position opposite to an open end of the conductor base, the conductor short-circuiting part having an inductance greater than an inductance of the conductor base,
wherein a part of the conductor base is partially formed using a plurality of linear conductors.

4. A noise suppression structure of a short-circuited termination type for suppressing an undesired high-frequency current flowing through a ground layer of a printed wiring substrate, the noise suppression structure comprising:
- a conductor base disposed apart from the ground layer with an interval in a thickness direction; and
- a conductor short-circuiting part which is connected to the ground layer at a position opposite to an open end of the conductor base, the conductor short-circuiting part having an inductance greater than an inductance of the conductor base,
- wherein the conductor base includes a pair of conductor base parts juxtaposed with an interval in a length direction, and
- wherein the conductor short-circuiting part includes a plurality of thin conductive lines connected to the conductor base, and intermediate portions connecting a plurality of vias connected between the ground layer and the plurality of thin conductive lines.

\* \* \* \* \*